United States Patent [19]
Daniels

[11] Patent Number: 5,424,822
[45] Date of Patent: Jun. 13, 1995

[54] THREE-DIMENSIONAL COLOR IMAGE PRINTER

[76] Inventor: John J. Daniels, 321-323 Roosevelt Dr., Seymour, Conn. 06483

[21] Appl. No.: 81,822

[22] Filed: Jun. 22, 1993

Related U.S. Application Data

[63] Continuation of Ser. No. 936,764, Aug. 27, 1992, Pat. No. 5,231,450.

[51] Int. Cl.⁶ ............................................. G04G 15/01
[52] U.S. Cl. .................................... 355/326 R; 355/27; 355/326 M; 430/138; 347/160; 347/121; 347/115
[58] Field of Search ...................... 355/326 R, 27, 266, 355/326 M; 346/157; 430/138

[56] References Cited

U.S. PATENT DOCUMENTS

| | | | |
|---|---|---|---|
| 4,865,943 | 9/1989 | Wright | 430/138 |
| 4,996,552 | 2/1991 | Sangyoji et al. | 355/27 |
| 5,050,531 | 9/1991 | Sakai | 355/27 |
| 5,097,286 | 3/1992 | Sakai | 355/27 |
| 5,142,337 | 8/1992 | Karidis et al. | 355/266 |

Primary Examiner—R. L. Moses
Attorney, Agent, or Firm—John J. Daniels

[57] ABSTRACT

A printer for forming an image by image-wise exposure of a layer of chromogenic microcapsules. The observable image produced may have a three-dimensional topographical structure, such as to form the bumps of the Braille alphabet, or to replicate the surface variations and texture of brush strokes of a conventional painting. A digitized photographic image can be printed in full color, and the photographic image can be computer enhanced. A locally variable attractive field member having an operable surface receives an image in a layer of chromogenic microcapsules. An optomagnetic and/or optoelectric coating on the attractive field member receives light information and generates an attractive field to selectively apply and vary a respective local attractive field associated with discrete locations of the operable surface. A plurality of field attractive microcapsules are attracted to the discrete locations of the operable surface so as to form a layer of field attractive microcapsules which may have a uniform or a varying thickness. The thickness depends on the respective local attractive field associated with discrete locations of the operable surface, and thus depends on the light information impinging on the optomagnetic and/or optoelectric coating. A three-dimensional or two-dimensional microcapsule structure can be formed on the operable surface. This microcapsule structure is image-wise exposed to form a latent image. Upon developing an curing, an observable image is produced which may replicate, for example, the surface variations and texture of a conventionally painted painting, or a photographic image.

19 Claims, 27 Drawing Sheets

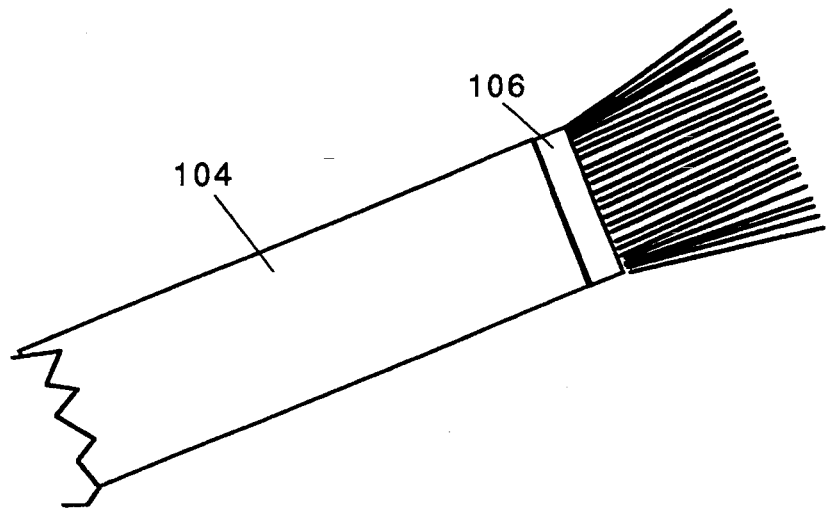
Figure 14(a)
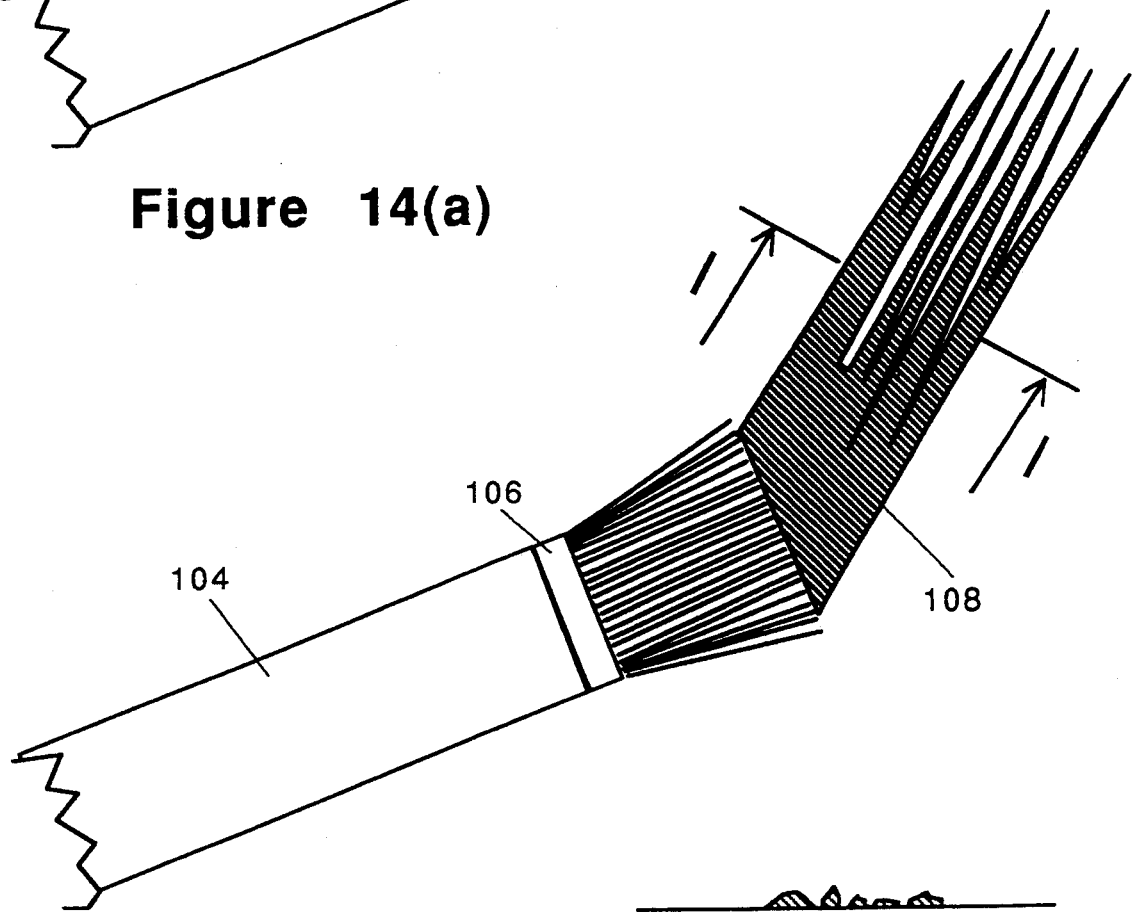
Figure 14(b)     Figure 14(c)

THREE-DIMENSIONAL COLOR IMAGE PRINTER

BACKGROUND OF THE INVENTION

This application is a continuation of application Ser. No. 07/936,764 filed Aug. 27, 1992, now U.S. Pat. No. 5,231,450.

The present invention pertains to a color printer for forming a single color, multi-color, or full color image hard-copy. More particularly, the present invention pertains to an advancement in the art of such printers which utilize image-wise exposure of a color forming layer of microcapsules to form a printed image.

Computers have been used to display wholly computer generated full color images on a computer monitor. Other images, such as photographs, can be scanned by a digital scanner and input to the computer in digitized form. For example, the Kodak Photo-CD stores photographic images on a CD-ROM. The image can be displayed on a television, or input in digital form to a computer. The computer can display the digitized image on its monitor, and this digitized image can be further manipulated by the computer to produce various computer enhancement effects. Many times it is desired to produce a hard-copy of the image observed on the computer monitor. There are known printers capable of forming a printed copy of a digitized image. However, these conventional printers have many drawbacks.

In accordance with the prior art, a method of producing an image is known in which microcapsules, which encapsulate therein a photosensitive material, have been utilized in the formation of an image by image-wise exposure of the microcapsules to electromagnetic radiation. The photosensitive material encapsulated in these microcapsules has a viscosity which changes upon irradiation by electromagnetic radiation, usually of a specified wave length. It is also known to produce an image of two or more colors, or a full color image, by providing two or more types of microcapsules. Each type encapsulates a photosensitive material which has a change of viscosity in response to a specific wave length of electromagnetic radiation for its type, and has a chromogenic color forming material included within the microcapsule. Thus, upon image-wise exposure of a uniform layer of such microcapsules to radiation of the specific wave length, a latent image may be formed in the layer of microcapsules. This latent image is later developed by rupturing the microcapsules in which the photosensitive material has a low viscosity, so as to permit the chromogenic material to react with a developer to form the image. In the case of a full color image, three types of microcapsules are used, each type containing one of a cyan, magenta, or yellow chromogenic color forming compound.

The image-wise exposure of the microcapsule layer is accomplished using an irradiation source, such as a CRT, LCD, or the like. Alternatively, a reflective type irradiation source may be used in which a light source irradiates an original. The light irradiated onto the original is reflected from the surface thereof and is transmitted through a focusing lens to image-wise expose the microcapsule layer.

A latent image is thus formed in the microcapsules by the selective viscosity change in an internal phase of the microcapsule containing the chromogenic material. This viscosity change is due to the photosensitive material in the microcapsule being exposed to the electromagnetic radiation. The latent image is then developed by rupturing the microcapsules, usually using pressure rollers, so that the chromogenic material of selected microcapsules can come into contact with a developing agent. Thus, an observable image is formed. This image will invariably have a flat two dimensional surface structure.

The microcapsule layer is usually formed through electrostatic attraction of the microcapsules so that a uniform layer of microcapsules is indiscriminately disposed covering the entire printable surface of a support sheet. Such a conventional apparatus is disclosed in U.S. Pat. No. 4,801,949, issued to Misono, et. al.

An image recording apparatus which uses the image recording method described above is disclosed in U.S. Pat. No. 4,399,209, issued to Sanders et. al. This patent discloses in detail the structure of the microcapsules used in such a recording method and that explanation is incorporated herein by reference. It is also known to incorporate a ferromagnetic material within a microcapsule shell as is disclosed in U.S. Pat. No. 3,954,666, issued to Marquisee et. al., and insofar as this patent discloses the formation of a microcapsule, the constituents of the microcapsule shell and the ferromagnetic material encapsulated therein, this patent is incorporated herein by reference. Thermal expansive microcapsules are known in the art and are formed by encapsulating a low boiling, vaporizable substance into a microcapsule of a thermal plastic resin. U.S. Patent No. 4,871,408, issued to Honma et. al. discloses such a thermal expansive microcapsule and is incorporated by reference herein. Furthermore, a heat meltable microcapsule is known in the art in which a heat meltable microcapsule has a capsule wall which includes infra-red absorbents which may absorb infra-red radiation at specific wave lengths to cause the heat meltable microcapsule to melt. U.S. Pat. No. 4,916,042, issued to Sakojiri, et. al. discloses such a microcapsule and its description is incorporated by reference herein.

Many drawbacks exist with the prior art printers which form a latent image in a microcapsule layer by image-wise exposure of electromagnetic radiation to the microcapsule layer. For example, there is no prior disclosure of a means for forming a three-dimensional topographical structure of an observable image by the selective build up of layers, having a varying thickness of microcapsules. Thus, there is no prior art which discloses such a structure. In fact, the only prior art which discloses a three-dimensional image is the Honma et. al. reference discussed above. However, in accordance with the teachings of Honma et. al., a uniform layer of thermal expansive microcapsules is formed, and then a toner image area is heated selectively so as to thermally expand the thermal expansive microcapsules in a selected region so as to raise the image.

Thus, there is no disclosure in the prior art of a color printer which is capable of producing an image having a topographical three-dimensional structure, such as to replicate the topographical three-dimensional structure of, for example, a conventionally painted painting. As shown in FIGS. 2(a) through 2(d), a conventional painting has an image which is formed by the application of paint using a conventional brush. The bristles of a conventional paint brush hold the paint so that when dragged across the surface of, for example, a portion of canvas, a brush stroke is left behind which has a topographical three-dimensional structure as shown in cross section in FIG. 2(c). This structure gives texture and expression to the painting which, heretofore, has been impossible to replicate using a microcapsule color printing method. Furthermore, there are many other instances where a three-dimensional printed structure is desirable, for example, the raised lettering of expensive letterhead or business cards. Conventionally, such raised lettering is very expensive and is only economical in large production lots. There is no known prior art which discloses any means for obtaining such raised lettering using a microcapsule printer. Also, there is no prior art which discloses a means by which information pertaining to a desired image may be transmitted over data transmission lines, such as telephone lines, so that a desired three-dimensional structure may be obtained at a remote site.

There are input devices known in the art which provide the location of the input and the display of the input signals so as to be observable at the same location. Examples of such input devices are disclosed in U.S. Pat. No. 4,631,356, issued to Taguchi et. al., U.S. Pat. No. 4,771,276, issued to Parks, and U.S. Pat. No. 4,875,036, issued to Washizuka et. al. However, these prior art input devices do not disclose any means by which a brush stroke of a conventional brush may be replicated by such an input device so that the information pertaining to a topographical three-dimensional structure of such a brush stroke may be obtained to thereby replicate such a brush stroke using a microcapsule printer.

SUMMARY OF THE INVENTION

The present invention is intended to overcome the drawbacks of the prior art and to provide a printer which is capable of producing an image having a three-dimensional topographical structure. It is an object of the present invention to provide such a printer which utilizes the selective attraction of field attractive microcapsules to form layers of varying thickness so as to replicate, for example, the topographical surface of a conventional paint brush stroke. It is another object of the present invention to provide a printer in which a color image may be formed at a selected area of a support sheet using a microcapsule printing method, while another image may be formed at another area of the support sheet using a similar or other printing method. It is a further object of the present invention to provide an input device with which an image can be input at a location where the image is displayed, such input device capable of providing information regarding an intended topographical structure to a processor.

In accordance with the present invention, a printer for forming an image by image-wise exposure of a layer of chromogenic microcapsules is provided. The printer includes image receiving means for receiving an image in a layer of chromogenic microcapsules. This image receiving means includes a locally variable attractive field plate which has an operable surface. The locally variable attractive field plate also includes a plurality of individually controllable attractive field sources, each in operable connection with a corresponding discrete location of the operable surface. Controlling means is provided for selectively controlling each individually controllable attractive field source so as to selectively apply and vary a respective local attractive field associated with each corresponding discrete location of the operable surface.

Microcapsule supplying means is provided for supplying a plurality of field attractive microcapsules to be attracted to at least one discrete location of the operable surface. The field attractive microcapsules form a layer having a thickness which depends on the respective local attractive field associated with each corresponding discrete location of the operable surface. Thus, in accordance with the present invention, a three-dimensional structure of the layer of field attractive microcapsules having a varying thickness can be formed by selectively applying a different respective local attractive field at two or more corresponding discrete locations of the operable surface. In accordance with the present invention, a three-dimensional microcapsule layer structure may be built-up by selectively attracting microcapsules so as to form the microcapsule layer having peaks and valleys. Also, in accordance with the present invention, a three-dimensional structure of the layer of field attractive microcapsules having a uniform thickness can be formed by selectively applying a same respective local attractive field at two or more corresponding discrete locations of the operable surface. Stated otherwise, it is also possible to form a uniform layer of microcapsules by applying a same respective local attractive field over the operable surface so that a uniform thickness of microcapsules is attracted at the locations of the operable surface having the same respective local attractive field applied thereto. The peaks and valleys may be formed by selectively applying different attractive field strengths to the operable surface so that the number of microcapsules over a given area can be controlled. Alternatively, different sized microcapsules may be provided so that relatively larger microcapsules can be selectively attracted to a given area, while relatively smaller microcapsules can be attracted to another area, thus forming the varying thickness layer.

In one embodiment of the present invention the controlling means includes means for selectively applying a variable electric current to each of the individually controllable field sources so as to selectively vary the respective local attractive field associated with each corresponding discrete location of the operable surface. Also, in an embodiment of the present invention, each of the individually controllable attractive field sources includes a core of magnetizable material, such as a ferromagnetic material (for example, iron), or a para-magnetic material (for example, aluminum). Each of the individually controllable attractive field source also includes a winding of current carrying material, such as metal wire, wound around the core. The winding of each individually controllable attractive field source is in electrical contact with the controlling means so as to be receivable of the corresponding variable electric current. Alternatively, the individually controllable attractive field sources may be comprised of other known magnetic field producing means, such as permanent magnetic disposable in operable contact with the surface through mechanical displacement means, or opto-magnetic means for optically controlling individual magnetic field sources.

In this embodiment of the present invention, at least one of the field attractive microcapsules and the chromogenic microcapsules comprise at least one of a color forming composition effective to form at least one color latent image upon image-wise exposure of electromagnetic radiation at a specific wave length, a thermal expansive composition effective to thermally expand upon image-wise exposure of electromagnetic radiation at a specific wave length, a heat-meltable composition effective to melt upon image-wise exposure of electromagnetic radiation at a specific wave length, an electrostatic attractive material effective to make the microcapsule electrostatically attractive, and a magnetic material comprising at least one of a wall of the microcapsules and an internal phase of the microcapsule and effective to make the microcapsules magnetically attractive.

In one embodiment of the present invention, an electrostatic attracting means is provided for applying an electrostatic attractive force over at least a portion of the operable surface. Thus, in accordance with the present invention, a uniform microcapsule base layer may be formed by electrostatic attraction. A release layer may be disposed over at least a portion of the operable surface and is effective to promote the release of either a recording sheet, a layer of undeveloped microcapsules, and a layer of developed microcapsules from the operable surface. This release layer may be, for example, a Teflon coating or the like.

In another embodiment of the present invention, the controlling means includes means for selectively applying a variable electric charge to each individually controllable field source to selectively vary the local attractive field associated with each corresponding discrete location of the operable surface. In this embodiment, each individually controllable attractive field source comprises a field applying member having a charge carrying surface. The field applying member is in electrical contact with the controlling means so as to be receivable of the variable electric charge. In this embodiment at least one of the field attractive microcapsules and the chromogenic microcapsules comprise an electrostatically attractive composition. It is noted that the field attractive microcapsules and the chromogenic microcapsules may have the same composition and come from the same microcapsule supply source.

Alternatively, the field attractive microcapsules may have a composition making the microcapsule field attractive while the chromogenic microcapsules may have a composition making the microcapsules color forming. It is also noted that the chromogenic microcapsules may be predisposed on the recording sheet and then the field attractive microcapsules may be built up upon the layer of chromogenic microcapsules to form a topographical three-dimensional structure.

A recording sheet supplying means may be provided for supplying a recording sheet to the image receiving means. This recording sheet is for supporting the layer of chromogenic microcapsules and the layer of locally attracted field attractive microcapsules. The microcapsule supplying means may be constructed in any of the conventional configurations, for example, a drum type microcapsule supplying means in which the drum is rotated adjacent to a source of microcapsules for deposition of the microcapsule on the drum surface, or any other suitable means.

A specific embodiment of the microcapsule supplying means includes a microcapsule source for cascading the plurality of field attractive microcapsules in a stream adjacent to the locally variable attractive field plate. Thus, at least some of the field attractive microcapsules are attracted to the discrete locations of the locally variable attractive field plate so as to form the layer of field attractive microcapsules. In this embodiment, a microcapsule collector collects the field attractive microcapsules of the stream that are not attracted to the discrete locations of the locally variable attractive field plate. This microcapsule collector may include attractive field producing means including at least one of an electrostatic field producing means and a magnetic field producing means for producing an attractive field to collect the field attractive microcapsules of the stream that are not attracted to the discrete locations of the locally variable attractive field plate.

In another embodiment of the present invention, the microcapsule supplying means includes microcapsule containing means for containing the plurality of field attractive microcapsules adjacent to the locally variable attractive field plate. Thus, at least some of the plurality of field attractive microcapsules can be attracted to the discrete locations of the locally variable attractive field plate so as to form the layer of field attractive microcapsules. The field attractive microcapsules may be in a dry form, wherein the microcapsules are not dispersed in a dispersing liquid, or in a wet form, wherein the microcapsules are dispersed in a dispersing liquid.

An input device is constructed in accordance with the present invention having a magnetic field applier, such as a magnetic pen having a magnetic tip, or a magnetic brush having magnetic bristles. The input device selectively inputs a magnetic field over portions of the surface of a magnetic detecting plate. This magnetic detecting plate has means for detecting the magnetic field applied thereupon. For example, the magnetic field may induce an electric current in intersecting electrodes, having induced field detectors associated therewith, so that the position and field strength of the magnetic field can be detected as the magnetic field applier is drawn over the surface of the magnetic detecting plate. The induced electric current is amplified and received by a processor which determines the corresponding location and field strength of the magnetic field being induced in the electrodes. This determination is used to control an image projection device through a display controller so that the corresponding image is displayed on the image projection device.

Preferably, the magnetic detecting plate is transparent and disposed in front of the observable surface of the image projection device. This orientation allows a user to observe the image at the same observed location as it is input, as the user draws the magnetic field applier over the surface of the magnetic detecting plate.

Therefore, in accordance with a preferred embodiment of the present invention, an observable image may be produced which has a topographical three-dimensional structure consistent with a conventional painting. By selectively controlling the build up of the microcapsule layer thickness at the selected portions as the image is formed, the peaks and valleys associated with a conventional painting brush stroke may be replicated so that the surface texture of a conventional painting may be replicated. Since the image may be formed digitally, the same "work of art" may be repeatedly produced having consistent features. Also, an existing photograph or other image carrying device can be digitized so the image may be manipulated, using for example a computer. The observable image resulting from this manipulated image can have a texture, so as to look like it was painted. Many other exotic effects are contemplated by the present invention. Heretofore, a three-dimensional topographical image structure has only been available through painstaking application of paint using a conventional brush. There are many effects which may be obtained using the present invention which are not possible using conventional painting techniques. Thus, the present invention greatly expands and enhances the creation process of such works of art.

Furthermore, in accordance with the present invention, a three-dimensional image may be produced which has bumps corresponding to the Braille alphabet. Thus, Braille text may be produced which may be "read" through feeling by the visually handicapped. Also, the present invention may be utilized to selectively dispose an image at a selected area of a recording sheet while leaving the rest of the recording sheet free from any inclusion of microcapsules or image. Thus, a full color image may be provided at a selected portion of a recording sheet while a laser print of text may be provided at other portions of the recording sheet so as to enhance the versatility of the printer and provide a good looking final product. Furthermore, the present invention may be utilized to produce, for example, letterhead having raised lettering in small quantities. Currently, such letterhead having raised lettering is very expensive and is economical only in relatively large production lots.

In accordance with the present invention, it is possible to produce an image which may appear to be hand-painted on a substrate which is transparent. Presently, when producing high-quality animation, a pain-staking, labor intensive and time consuming method is used by which images are hand-painted by animation artists onto individual sheets (known as "cels"). Usually, the sheet is made of a transparent material. About 30 cels per second of animation is required to obtain good results. This process is extremely expensive and inefficient. In accordance with the present invention, computer generated in-rages may be disposed on a suitable substrate to form the cels. Thus, an animator can utilize the speed and efficiency of the computer to obtain a high-quality animation. The image can be formed by attracting microcapsules directly to the substrate prior to forming the latent image, by forming the latent image and than transferring the microcapsule layer to the substrate, by developing and curing the latent image into an observable image and then transferring the observable image to the substrate, etc. Also, when producing a reproduction of, for example, a photographic slide or other original which has dimensions inconsistent with that of a standard recording sheet (i.e. a sheet of paper), the original image has to be cropped or else an unsightly portion occurs on the reproduced observable image where the original does not expose the reproduction. The present invention can thus be utilized to provide a good looking reproduction by attracting microcapsules only to those portions of the recording sheet which coincide with the original image.

BRIEF DESCRIPTION OF THE DRAWINGS

FIG. 14(a) is a plan view of a magnetic brush of and inventive input device in accordance with the present invention;

FIG. 14(b) is a plan view of the magnetic brush shown in FIG. 14(a) also showing a magnetic brush stroke;

FIG. 14(c) is a cross sectional view along the line I—I of FIG. 14(b) showing a three-dimensional representation of a corresponding magnetic field strength of the magnetic brush stroke;

DETAILED DESCRIPTION OF THE INVENTION

Figure 1:
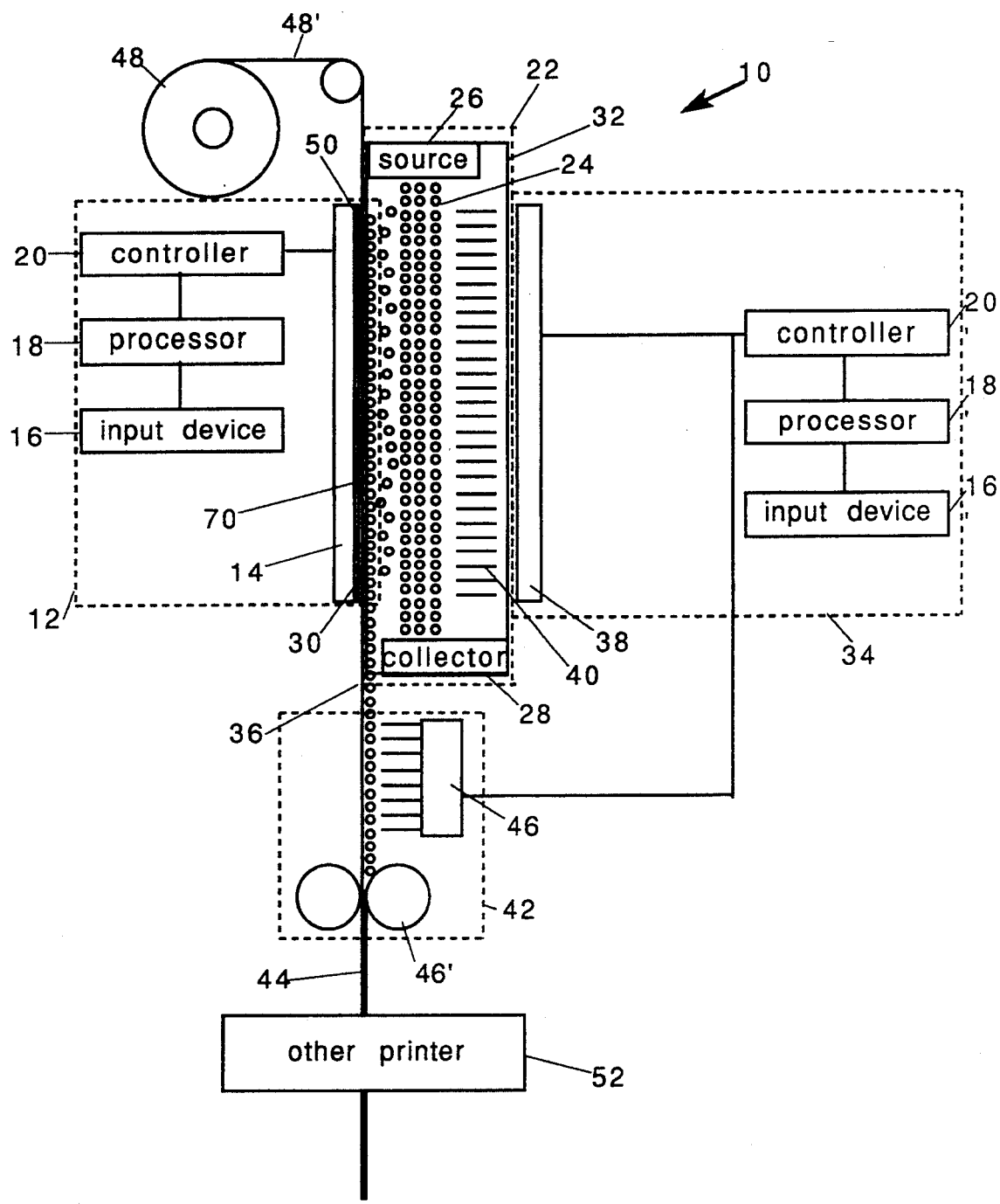
FIG. 1 is a schematic representation of a printer in accordance with the present invention.

For purposes of promoting an understanding of the principles of the invention, reference will now be made to the embodiments illustrated in the drawings and specific language will be used to describe the same. It will nevertheless be understood that no limitation of the scope of the invention is thereby intended, there being contemplated such alterations and modifications of the illustrated device, and such further applications of the principles of the invention as disclosed herein, as would normally occur to one skilled in the art to which the invention pertains.

Referring to FIG. 1, an embodiment of the inventive printer 10 is shown. The inventive printer 10 is for forming an image by image-wise exposure of a layer of chromogenic microcapsules. In a preferred embodiment, at least three different kinds of microcapsules are provided and form a layer. Each kind of microcapsule is capable of producing one of a cyan color, a magenta color, or a yellow color. The composition of the chromogenic microcapsules will be discussed in detail below.

The inventive color printer 10 as shown in FIG. 1, includes image receiving means 12 for receiving an image in a layer of chromogenic microcapsules. The image receiving means 12 includes a locally variable attractive field plate 14. The image receiving means 12 also includes image receiving controlling means for controlling the locally variable attractive field plate 14 to selectively vary a respective local attractive field at corresponding discrete locations of the locally variable attractive field plate 14. In the embodiment shown in FIG. 1, the controlling means includes an input device 16, such as a computer, digitizer for digitizing an image reflected from an original, or any other input devices which may supply input signals corresponding to an image to a processor 18. The processor 18 processes the signals input from the input device 16 and generates a corresponding image receiving signal dependent thereon. This image receiving signal is received by a controller 20 which is effective to control the locally variable attractive field plate 14 by selectively varying a respective local attractive field at corresponding discrete locations of the locally variable attractive field plate 14.

In operation, a topographical three-dimensional structure of the field attractive microcapsules 24 may then be constructed upon the image forming microcapsule base layer 30 so as to provide a three-dimensional structure having peaks and valleys as shown in detail herein. Alternatively, the image forming microcapsule base layer 30 may be formed after the formation of the peaks and valleys formed by the locally attracted field attractive microcapsules 24 as will also be described in more detail herein.

The inventive printer 10 further comprises microcapsule supplying means 22 for supplying a plurality of field attractive microcapsules 24 to be attracted to the discrete locations of the locally variable attractive field plate 14 depending on each locally attractive field. Thus, a layer of field attractive microcapsules 24 is formed having a thickness depending on the corresponding attractive field at each respective discrete location of the locally variable attractive field plate 14. As shown in FIG. 1, a microcapsule source 26 supplies a plurality of field attractive microcapsules 24 which, as shown in this embodiment, are allowed to cascade between the source and a collector 28. Some of these cascading field attractive microcapsules 24 are attracted to the locally variable attractive field plate 14 due to the attractive field present at the discrete locations of the locally variable attractive field plate 14. In accordance with the inventive printer 10, to form a uniform layer of field attractive microcapsules 24, the locally variable attractive field plate 14 has applied at every discrete location a uniform corresponding attractive field. Thus, a uniform image forming microcapsule base layer 30 may be formed.

In the embodiment shown in FIG. 1, the collector 28 comprises a controllably variable attractive field source which is effective for attracting at least some of those field attractive microcapsules 24 which are not sufficiently attracted to the locally variable attractive field plate 14 to be disposed as the image forming microcapsule base layer 30 or disposed so as to form a three-dimensional topographical structure. Depending on the type of microcapsule used, the collector 28 may provide a magnetically attractive field or an electrostatically attractive field. Furthermore, shown in FIG. 1 as a solid-line rectangle, a screen 32 is provided enclosing at least the microcapsule source 26, the microcapsule collector 28 and the space therebetween. This screen 32 is effective to reduce the excessive loss of the cascading field attractive microcapsules 24. It is noted that this screen 32 may include means to provide a repulsive force to encourage the field attractive microcapsules 24 toward either the locally variable attractive field plate 14 or the collector 28, and may include a release coating, such as Teflon or the like, to prevent the field attractive microcapsules 24 from sticking on the screen 32.

The inventive printer further comprises image forming means 34 for image-wise exposing the layer of chromogenic microcapsules to form a latent image 36 therein. In the embodiment shown in FIG. 1, the image forming means 34 includes an irradiation source 38 for providing image carrying radiation 40 to image-wise expose the layer of chromogenic microcapsules. This image carrying radiation 40 preferably comprises at least three different wavelengths of electromagnetic radiation, each one of which is effective to cause the selective color formation from a corresponding cyan, magenta, or yellow color forming microcapsule. By such image-wise exposure, a full color image may be produced through the selective releasing and mixing of the cyan, magenta and yellow color forming chromogenic material.

In the embodiment shown in FIG. 1, the image forming means 34 includes image forming controlling means (which may utilize one or more of the same components as the image receiving controlling means). An input device 16', such as a computer, or any other device which may provide input signals corresponding to an image is provided. The input signals are received by a processor 18', such as a computer microprocessor, to determine image forming signals dependent thereon. These image forming signals are received by a controller 20' to control the irradiation source 38 so as to selectively image-wise expose the layer of chromogenic microcapsules and produce the latent image 36 therein. The irradiation source 38 may be a CRT, LCD, LED, laser, or other image radiation source, including also a reflective type irradiation source in which light is reflected from an original and is focused so as to image-wise expose the layer of chromogenic microcapsules. Also, a fiber-optic face plate CRT may be used to image-wise expose the layer of chromogenic microcapsules. A fiber optic face plate is advantageous, for example, because the image can be sharply focused when exposing the microcapsules. An example of a fiber-optic face plate CR is disclosed in U.S. Pat. No. 4,978,978, issued to Yamada, the disclosure of which is incorporated by reference herein.

The inventive color printer 10 further comprises image developing means 42 for developing the latent image 36 to form an observable image 44. In the preferred embodiment of the present invention, the image developing means 42 includes a heat source 46. This heat source 46 is effective to thermally rupture the chromogenic microcapsules forming the latent image 36 so that the chromogenic material in the microcapsules can be released and developed to form the observable image. Alternatively, the image developing means 42 may include pressure rollers 46' to rupture the chromogenic microcapsules by providing a rupturing pressure force. As will be discussed in detail below, the present inventive printer 10 may be used to form an image having a three-dimensional topographical structure, in which case it is preferable to use the heat source to rupture the microcapsule to form the observable image. It is contemplated that the developer may be present on the recording sheet in microcapsule form. Alternatively, the developer may be applied by spraying, dipping etc., or may be applied by other methods consistent with the prior art.

In the embodiment of the inventive printer shown in FIG. 1, recording sheet supplying means 48 is provided for supplying a recording sheet 48' to the image receiving means 12. The recording sheet 48' is for supporting the layer of chromogenic microcapsules and the layer of locally attractive field microcapsules 24. Thus, a recording sheet 48', which may be paper, synthetic paper, plastic or other suitable medium, is first disposed over an operable surface 50 of the locally variable attractive field plate 14. Then, the image receiving controlling means controls the locally variable attractive field plate 14 and includes varying means to selectively vary the respective local attractive field at corresponding discrete locations of the locally attractive field plate while the field attracted microcapsules are cascaded from the microcapsule source 26. Thus, the image forming microcapsule base layer 30 may be formed.

Alternatively, the image forming microcapsule base layer 30 may be provided on the recording sheet 48' prior to the recording sheet 48' being disposed adjacent to the locally variable attractive field plate 14. Then, an additional layer of field attractive microcapsules 24 may be provided over the image forming microcapsule base layer 30 at selected locations by varying the attractive field at the discrete locations of the locally variable attractive field plate 14.

Alternatively, the image forming microcapsule base layer 30 may be provided by applying a uniform attractive field, such as a uniform electrostatic field, to the surface of an electrostatic attracting means 70 disposed adjacent to the surface of the locally variable attractive field plate 14, and then additional microcapsules may be disposed at the discrete locations by varying the local attractive field. For example, a uniform image forming microcapsule base layer 30 may be provided through electrostatic attraction while an additional field attractive microcapsule layer 24 having a thickness, which may vary from location to location, may be provided through magnetic attraction at selectable discrete locations of the locally variable attractive field plate 14.

The inventive printer 10 may further comprise an additional printing means 52, such as another printer, which may be provided before or after the locally variable attractive field plate 14 to dispose on the recording sheet 48' images additional to those images formed by the image receiving means 12 and the image forming means 34. This other printer may be, for example; a laser printer, another microcapsule type printer, an impact printer, a thermal printer, or any other suitable printer. Thus, a combination of types of printed images may be provided on a single recording sheet 48'. For example, it is contemplated that text may be printed on the recording sheet 48' using a laser printer and then a full color image, such as the reproduction of a photograph, may be printed on the same recording sheet 48' using the image receiving means 12 and the image forming means 34 described herein.

In accordance with the inventive printer 10, an image may be formed which has a three-dimensional topographical structure so as to provide, for example, the texture and detail associated with a conventional painting. Furthermore, the inventive printer may be provided to form an image of raised bumps, such as the raised bumps which form the Braille alphabet used by the blind. Also, in accordance with the inventive printer, an image may be provided which is disposed only at a selected portion or portions of a recording sheet 48' while the rest of the recording sheet 48' remains uncoated with microcapsules. Thus, for example, a laser printed recording sheet 48' may also have a full color image disposed thereon without diminishing the appearance of the laser printed image.

Figure 2A:
FIG. 2(a) is a representation of a conventional painting.
Figure 2D:
FIG. 2(d) is a cross sectional view along line II—II of the conventional painting shown in FIG. 2(a)
Figure 2E:
FIG. 2(e) is a cross sectional view of a conventionally printed image.
Figure 2B:
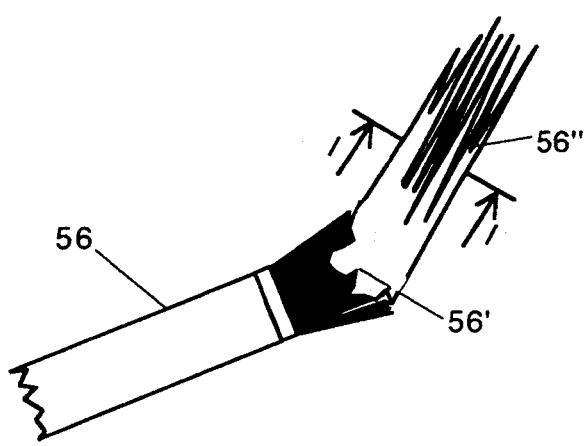
FIG. 2(b) is a plan view of a conventional brush and brush stroke.
Figure 2C:
FIG. 2(c) is a cross sectional view along line I—I of the brush stroke shown in FIG. 2(b)

FIG. 2(a) shows a conventional painting 52 is formed by applying paint using, for example, a conventional brush 56 shown in FIG. 2(b). The conventional brush 56 has bristles which hold a small quantity of paint 56'. These bristles are dragged across the surface of a receiving medium, such as a canvas, and leave a brush stroke 56" comprised of paint 56' removed from the bristles and adhered to the canvas. This brush stroke 56" has a three-dimensional topographical structure as shown in FIG. 2(c) which is a cross section of the brush stroke 56" along lines I—I. This three-dimensional topographical structure of the brush stroke 56" gives fine detail and texture to the painting, adding to its appeal and expression.

FIG. 2(d) shows the cross section along line II—II of the conventional painting 52 shown in FIG. 2(a). This cross section has a topographical three-dimensional structure of the image painted in conventional painting 52 shown in FIG. 2(a), which is composed of many brush strokes which have been applied to the canvas to form the conventional painting 52. These brush strokes create the texture and three-dimensional depth of the conventional painting 52 thereby forming an image which has added appeal and expression as compared to a flat image.

FIG. 2(e) is a representation of the flat image 58, such as that produced by a conventional color printer. In contrast with the conventional painting 52, this flat image 58 has no texture or topographical surface variation which add to the appeal and expression of the image. Thus, when a painting is reproduced using a prior art color printer, the image reproduced is flat and lacks the appeal and expression which was present in the original.

Figure 3:
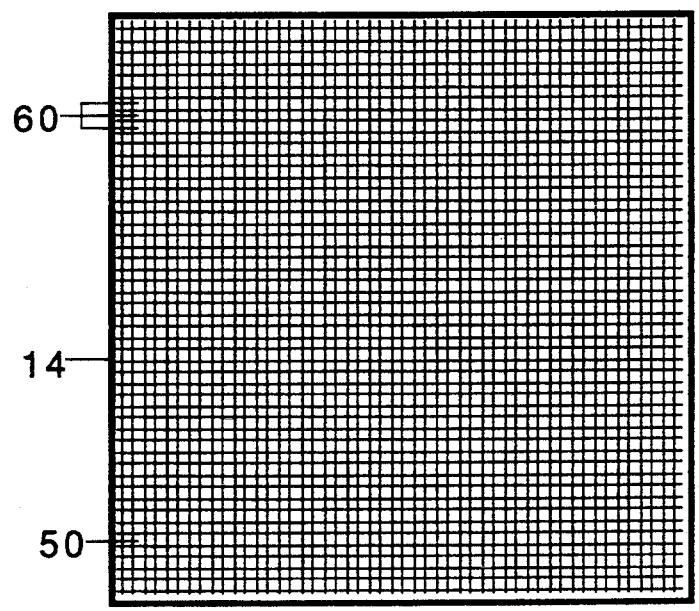
FIG. 3 is a front view showing the operable surface of the locally variable attractive field plate in accordance with the present invention.

Referring now to FIG. 3, a view of the operable surface 50 of the locally variable attractive field plate 14 is shown. In accordance with a preferred embodiment of the present invention, the operable surface 50 of the locally variable attractive field plate 14 has disposed thereon a plurality of equally spaced attractive field variable pixels 60 which are provided at discrete portions of the operable surface 50. These attractive field variable pixels 60 may be controlled so as to locally vary the attractive field at the discrete portions of the operable surface 50 Therefore, the attraction of the field attractive microcapsules 24 can be controlled so as to form a layer of field attractive microcapsules 24 having a thickness which depends on the local attractive field associated with each corresponding discrete location of the operable surface 50. Thus, a three-dimensional structure of the layer of field attractive microcapsules 24 having a varying thickness can be formed by selectively applying a different respective local attractive field at two or more corresponding discrete locations of the operable surface 50. Also, a three-dimensional structure of the layer of field attractive microcapsules 24 may be formed having a uniform thickness by selectively applying a same respective local attractive field at two or more corresponding discrete locations of the operable surface 50.

Stated otherwise, an image having a cross sectional structure such as that shown in FIG. 2(d) may be ultimately formed by applying a different respective local attractive force at two or more corresponding discrete locations of the operable surface 50 while an image having a flat three-dimensional structure as that shown in FIG. 2(e) may ultimately be formed by selectively applying a same respective local attractive field at the discrete locations of the operable surface 50.

Figure 4A:
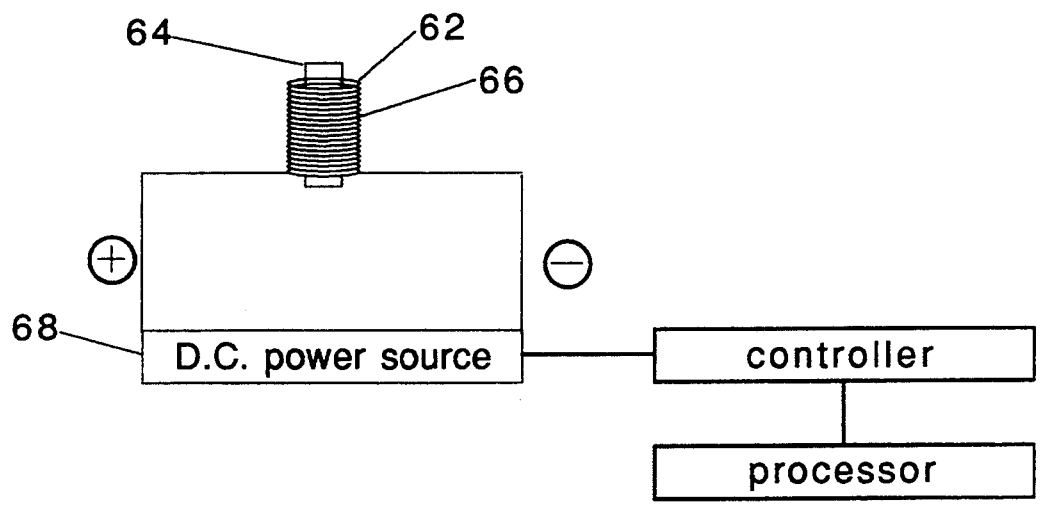
FIG. 4(a) is a schematic representation of an individually controllable electromagnetic source, varying means, controller and processor in accordance with a preferred embodiment of the present invention.

In accordance with a preferred embodiment of the present invention, as shown in FIG. 4(a), the locally variable attractive field plate 14 may comprise magnetic field applying means for applying each local attractive field as a magnetically attractive field wherein the magnetic field applying means comprises a plurality of respectively individually controllable electromagnetic sources 62 for applying each corresponding local magnetically attractive field. Each of the plurality of individually controllable electromagnetic sources 62 may comprise a core 64 of magnetizable material (such as a ferromagnetic material, for example, iron, or a paramagnetic material, for example, aluminum). A winding 66 of current carrying material (such as an electrically conductive metal wire) is wound around the core 64. Each winding 66 is in electrical contact with the varying means, which includes a variable d.c. power source 68, so as to be receivable of a corresponding variable electric current to selectively vary the respective local magnetic field at the corresponding discrete locations of the operable surface 50 of the locally variable attractive field plate 14. Furthermore, as shown in FIG. 1, an electrostatic attracting means 70 may be provided for electrostatically attracting the image forming microcapsule base layer 30. Alternatively, the image forming microcapsule base layer 30 may be formed by applying a uniform magnetic field to each of the individually controllable electromagnetic sources 62.

Figure 4B:
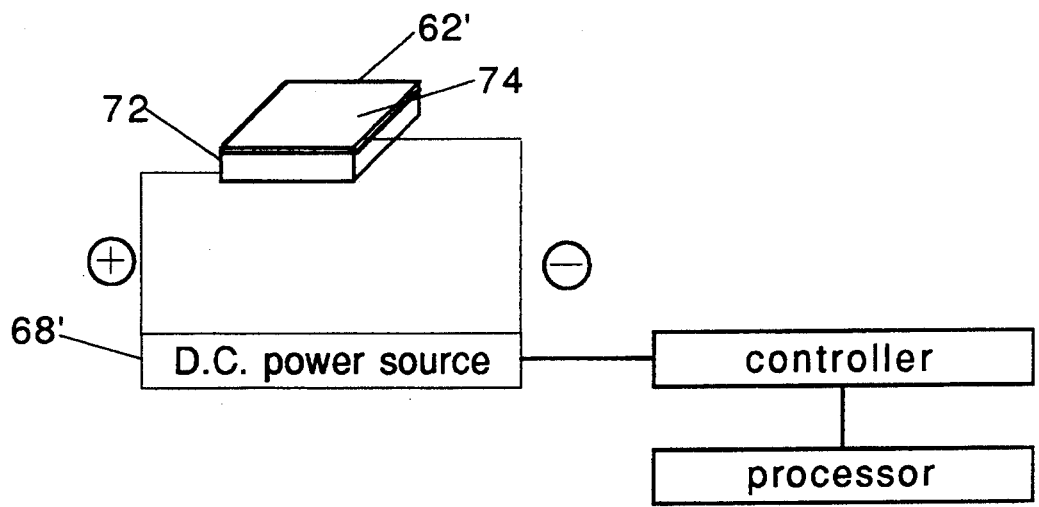
FIG. 4(b) is a schematic representation of an individually controllable electrostatic source, varying means, controller and processor.

As shown in FIG. 4(b), the locally variable attractive field plate 14 may comprise electrostatic field applying means for applying each local attractive field as an electrostatically attractive field, and the controlling means may include varying means for selectively varying a respective electrostatic field at the corresponding discrete locations of the locally variable attractive field plate 14. As shown in FIG. 4(b), the electrostatic field applying means may comprise a plurality of individually controllable electrostatic sources 62'. Each individually controllable electrostatic source 62' includes a field applying member 72 having a charge carrying surface 74 and is an electrical contact with the varying means so as to be receivable of a variable electric charge. As shown, the varying means may include a d.c. power source 68'which applies a variable charge to the charge carrying surface 74 so as to selectively vary the local attractive field associated with each corresponding discrete location of the operable surface 50 of the locally variable attractive field plate 14.

Figure 5A:
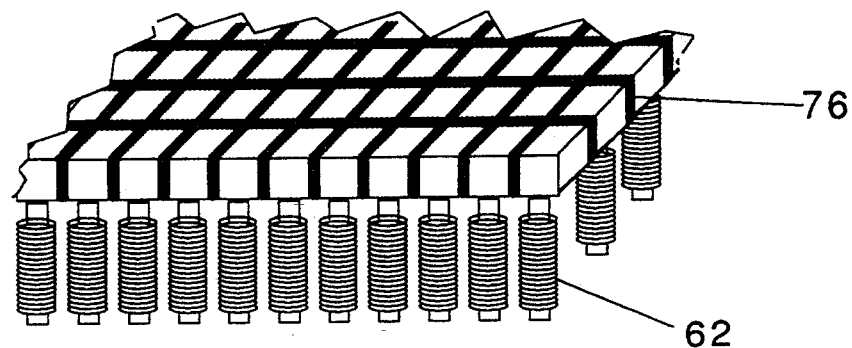
FIG. 5(a) is a perspective view of a portion of the locally variable attractive field plate showing individually controllable electromagnetic sources and magnetically variable pixels.

FIG. 5(a) shows a portion of the locally variable attractive field plate 14 in which the operable surface 50 is divided into equally spaced magnetically variable pixels each having associated therewith an individually controllable electromagnetic source 62. A magnetic insulation 76 may be provided between the equally spaced magnetically variable pixels so as to limit the magnetic influence of adjacent pixels. It is noted that the present invention contemplates that the operable surface may be undivided and either the back of the locally variable attractive field plate 14 or the operable surface 50 coated with an opto-magnetic material, such as MaBi, TbFeO$_3$, GdIG, DgCO, GdFe, TbFe, GdTbFe or TbDgFe, which has magnetic properties depending on an applied electromagnetic radiation. In this case, the image receiving controlling means may include a light source (which may be the irradiation source 38 of the image forming means 34) for selectively irradiating the locally variable attractive field plate to variably control the strength and polarity of the opto-magnetic effect at the discrete locations.

Figure 5B:
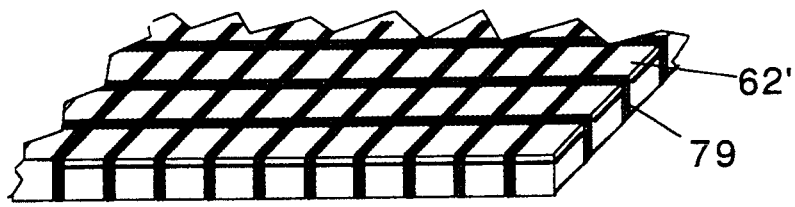
FIG. 5(b) is a perspective view of a portion of the locally variable attractive field plate showing individually controllable electrostatic sources and electrostatically variable pixels.

FIG. 5(b) shows a portion of the locally variable attractive field plate 14 in which the operable surface 50 is comprised of a plurality of individually controllable electrostatic sources 62'. These individually controllable electrostatic sources 62' form equally spaced electrostatically variable pixels made from an electrically conductive material, such as steel, aluminum, or other suitable electrostatic conductor. An electrically insulating material 79 may be disposed between the equally spaced electrostatically variable pixels so as to limit the electrostatic influence among adjacent pixels. It is noted that the present invention contemplates that the operable surface may be undivided and either the back of the locally variable attractive field plate 14 or the operable surface 50 coated with an opto-electrostatic material which has electrostatic properties depending on an applied electromagnetic radiation. In this case, the image receiving controlling means may include a light source (which may be the irradiation source 38 of the image forming means 34) for selectively irradiating the locally variable attractive field plate to variably control the strength and polarity of the opto-electrostatic effect at the discrete locations.

Figure 6A:
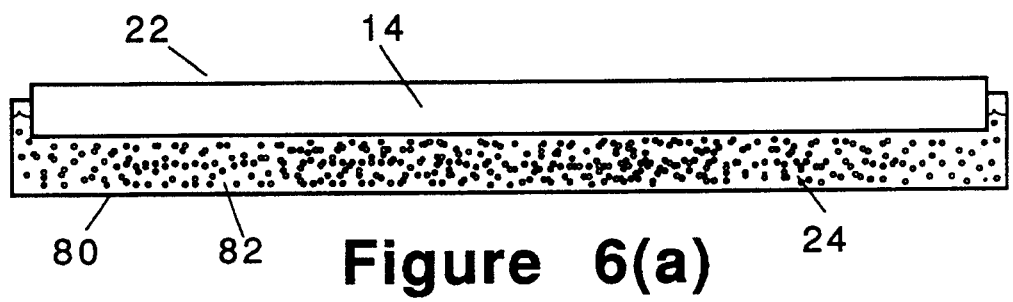
FIG. 6(a) is a cross sectional view of an alternative microcapsule supplying means showing containing means and microcapsules dispersed in a fluid prior to the formation of an image forming microcapsule base layer.
Figure 6B:
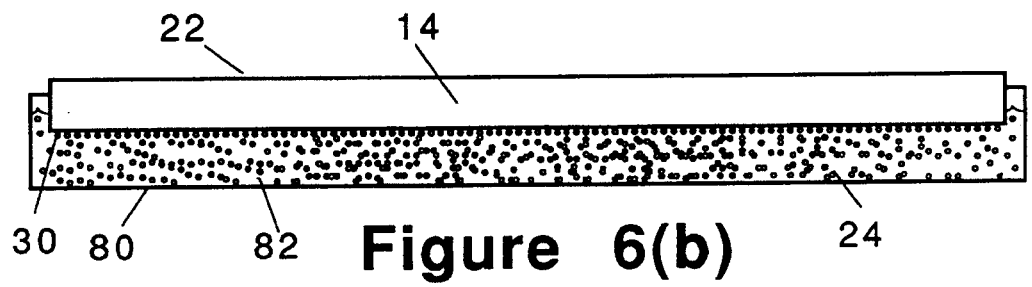
FIG. 6(b) is a cross sectional view of the alternative microcapsule supplying means shown in FIG. 6(a) after the formation of the image forming microcapsule base layer.

Referring now to FIGS. 6(a) and 6(b), an alternative embodiment of the microcapsule supplying means 22 is shown. In this embodiment, the microcapsule supplying means 22 includes microcapsule containing means 80 for containing the plurality of field attractive microcapsules 24 at a position which is adjacent to the locally variable attractive field plate 14 so that at least some of the plurality of field attractive microcapsules 24 can be attracted to the discrete locations of the locally variable attractive field plate 14 so as to form the layer of field attractive microcapsules 24. The field attractive microcapsules 24 may be in a dry form wherein the microcapsules are not dispersed in a dispersing liquid 82 or, as shown, in a wet form wherein the microcapsules are dispersed in a dispersing liquid 82. Furthermore, the dispersing liquid 82 may be agitated such as by a fluid pump (not shown) to maintain an even statistical distribution of the microcapsules dispersed therein.

As shown in FIG. 6(b), upon the application of a uniform attractive field (such as a uniform magnetic field or a uniform electrostatic field) an image forming microcapsule base layer 30 is formed on the operable surface 50 of the locally variable attractive field plate 14. Upon application of a non-uniform attractive field, a microcapsule layer (which may be include chromogenic microcapsules for image formation) is built up of the locally attracted attractive field microcapsules 24.

Figure 7A:
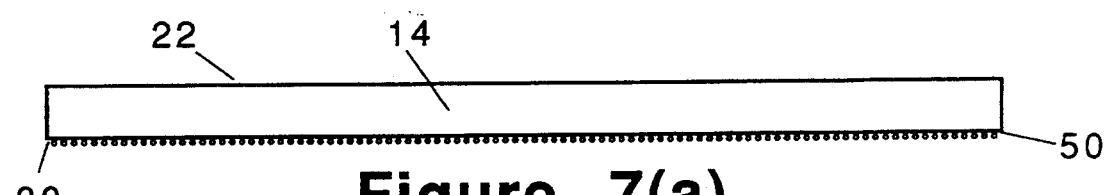
FIG. 7(a) is a cross sectional view of the locally variable attractive field plate having the image forming microcapsule base layer disposed thereon.
Figure 7B:
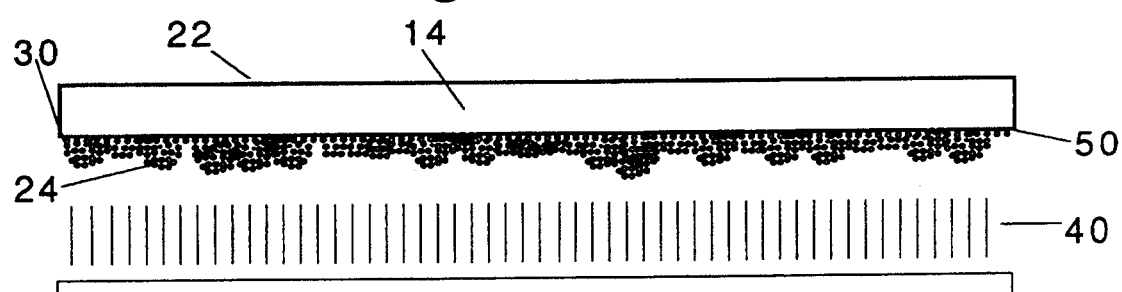
FIG. 7(b) is a schematic representation of a three-dimensional structure of image forming microcapsules built up over an image forming microcapsule base layer on the operable surface of the locally variable attractive field plate, and the irradiation source irradiating image carrying radiation thereon.
Figure 7C:
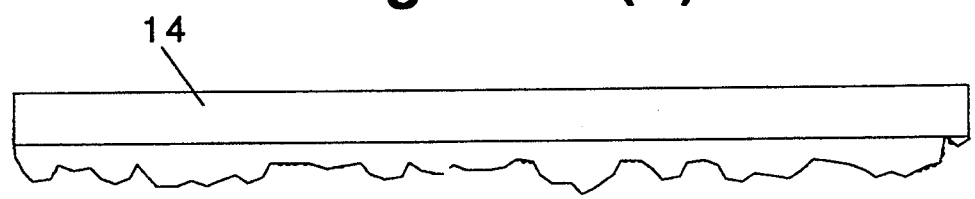
FIG. 7(c) is a cross sectional representation of a developed and cured three-dimensional image on the locally variable attractive field plate.

Referring to FIGS. 7(a) through 7(c), a schematic representation of one of the ways contemplated of forming an image having a three-dimensional topographical structure is shown. It is noted, that in accordance with the present invention a number of other ways of effecting the desired result may be utilized, some of which are described herein. However, it is further noted that the ways of obtaining the desired image utilizing the present invention shown in these drawings and described herein are illustrative of the various components of alternative combinations contemplated within the scope of the present invention.

FIG. 7(a) shows a side view of the locally variable attractive field plate 14 on which an image forming microcapsule base layer 30 has been formed. This image forming microcapsule base layer may be formed over a recording sheet 48' (as shown in FIG. 1) or may be formed directly onto the operable surface 50 of the locally variable attractive field plate 14. In this case, upon curing, and if an appropriate microcapsule composition is chosen, a self supportive structure may be formed of the cured and developed microcapsules which may alternatively be transferred to a supporting sheet or simply left as supporting on its own. This image forming microcapsule base layer 30 may be formed either by applying a uniform electrostatic field or a uniform magnetic field to attract the microcapsules.

As shown in FIG. 7(b), a build-up of a three-dimensional structure of image forming microcapsules is shown which includes the peaks and valleys which replicate, for example, the brush strokes of a conventional painting 52, the bumps of a Braille alphabet, or the raised lettering of a letterhead, or the like. It is further contemplated that the inventive printer 10 may be utilized to provide a three-dimensional structure used for promotional and advertising purposes or any other application in which such a three-dimensional topographical structure may be advantageous. FIG. 7(b) further shows the irradiation source 38 irradiating the three-dimensional structure of image forming microcapsules with image carrying radiation 40 to selectively expose the microcapsules according to the image-wise exposure of the image carrying radiation. FIG. 7(c) shows the three-dimensional structure of the image forming microcapsules after being developed and cured. Thus, it can be appreciated that a topographical three-dimensional structure, such as the replication of a conventional brush stroke, may be achieved through the utilization of the present invention.

Referring to FIGS. 8(a) through 8(d), various compositions of the microcapsules utilized in the present invention are shown. It is noted that these specific compositions are illustrative only and are not meant to limit the possible composition of the microcapsules. For example, it is well known in the art that various pigments may be used together with various color forming agents, photo-initiators, various developers, etc. Various microcapsules compositions are known in the art. U.S. Pat. Nos. 5,047,308; 4,025.455; 4,977,060; 4,929,531; 4,576,891; and 4,440,846 all disclose various compositions of microcapsules which include a chromogenic material and a photosensitive composition in which image-wise exposure and capsule rupture renders the chromogenic material image-wise accessible to a developer for a patterned image forming reaction. These patents are incorporated by reference herein as far as disclosing various compositions for the color forming material, developer, shell construction ect., as well as methods for making the microcapsules which may be utilized in accordance with the present invention.

However, the present invention further contemplates additional modifications to these microcapsules compositions rendering, in some cases, new compositions which are patentably distinct from these cited references. In accordance with an embodiment of the present invention, at least three types of microcapsules are provided which contain within the microcapsules a composition which may be image-wise exposed so as to form one of a cyan C, magenta M, or yellow Y color. It is the formation and mixture of these three base colors which forms the full color observable image. The composition of such microcapsules may include a material which is electrostatically attractive, so that the electrostatic attractive components of the present invention may be utilized. The shell of the microcapsule is preferably a heat meltable substance which forms at least a semi-rigid, strong integral structure upon curing of the observable image. The internal phase of those microcapsules which do not release their chromogenic material should become part of this at least semi-rigid, strong integral structure so that the three-dimensional topographical structure is effectively supported.

Figure 8A:
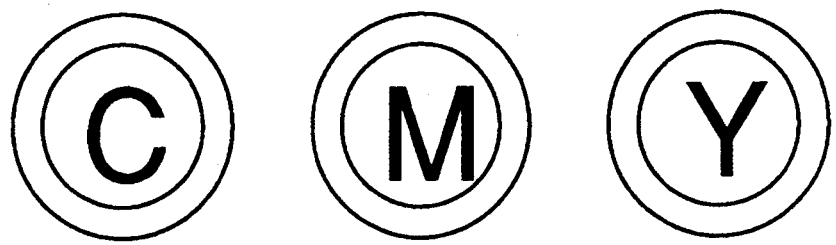
FIG. 8(a) is a schematic representation of color forming microcapsules.
Figure 8B:
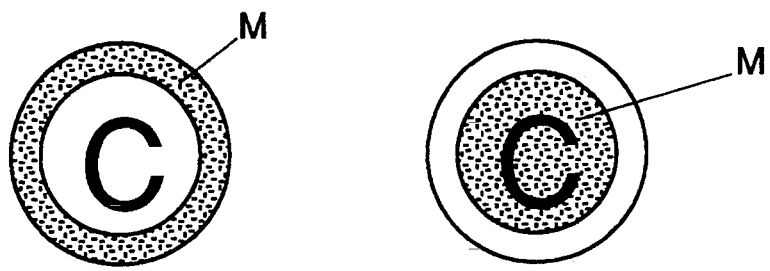
FIG. 8(b) is a schematic representation of color forming microcapsules showing the inclusion of a magnetic material.

In FIG. 8(b), a composition of the color forming microcapsules is shown and illustrated by the cyan C color forming microcapsule. In this case, the microcapsule may be composed of a microcapsule wall and an internal phase. The microcapsule wall may have a composition which includes a magnetic material M, or the internal phase may include a composition which has a magnetic material M (or both the wall and the internal phase may include compositions which have the magnetic material). This magnetic material may be, for example, a very fine powder of a ferromagnetic material or a para magnetic material or may be, especially in the case of the internal phase, a pigment which has magnetic attractive capabilities. Such a pigment may have a composition including, for example, titanium dioxide, alumina, silica, or mixtures thereof. Thus, a microcapsule may be provided which is magnetically attractive and can be utilized in accordance with the preferred embodiment of the invention in which the locally variable attractive field plate 14 has an operable surface 50 at which a selectively variable magnetic field is applied at discrete locations thereof. U.S. Pat. No. 3,954,666, issued to Marquisee et al., discloses a microcapsule encapsulating a ferromagnetic material such as acicular iron, $Fe_3O_4$, iron powder, "Alnico", nickel, cobalt, $CrO_2$, Ferrofluid (Ferrofluidics Corp.). As far as explaining the inclusion of these materials, and methods of forming encapsulating microcapsules, this patent is incorporated by reference herein.

Figure 8C:
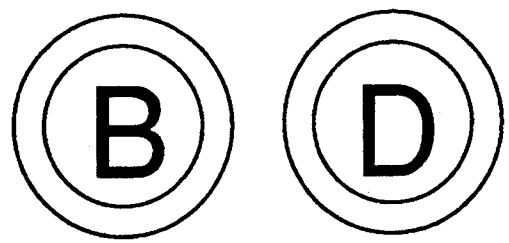
FIG. 8(c) is a schematic representation of black color forming microcapsules and developer microcapsules.

As shown in FIG. 8(c), to improve the contrast of the ultimate observable image produced in accordance with the present invention, a black B color forming agent may be a composition in at least some of the microcapsules included in the plurality microcapsules. Similar with the cyan C, magenta M, and yellow Y microcapsules, this black B color forming microcapsule operationally forms a black color depending on image-wise exposure of the microcapsule to a specified wavelength of electromagnetic radiation. Furthermore, a developer D may be provided in microcapsule form and a plurality of different microcapsule compositions may be provided each able to release the developer depending on image-wise exposure with a specific electromagnetic wavelength.

Figure 8D:
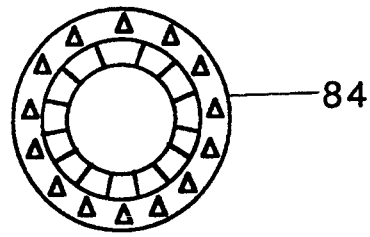
FIG. 8(d) is a schematic representation of a heat meltable microcapsule.

FIG. 8(d) shows a heat meltable microcapsule 84, in which infra-red rays having different wavelengths may be image-wise radiated to expose the microcapsule so as to cause color formation and to allow rupturing of the microcapsule using heat instead of pressure. Such a microcapsule composition is disclosed in U.S. Pat. No. 4,916,042, which is incorporated by reference herein as describing such a microcapsule composition. Further, it is noted that other compositions of microcapsules which may be heat meltable for rupturing are contemplated by this invention. For example, the microcapsule wall may be composed of a material which melts uniformly upon the application of heat at a specific temperature. Thus, the developing means 42 may include a heat source 46 which provides such a temperature to thereby rupture the microcapsules and produce the observable image 44 from the latent image 36 without requiring the application of pressure. The developer may be included in microcapsule form and ruptured with the chromogenic microcapsules, or may be applied to the top surface of the ruptured microcapsules to thereby develop the observable image. Also, a light source, such as a laser, may be provided for applying electromagnetic radiation at specific wavelengths effective to be absorbed by the heat meltable microcapsule 84 to generate heat.

It is contemplated within the scope of the invention that the microcapsules provided may include compositions having various attributes contributing to the appearance and physical structure of the cured observable image. For example, some microcapsules may have a glossy finish forming composition for giving the observable image a glossy finish look. Other microcapsules may have a fiat finish forming composition for giving the observable image a flat finish look. Still other microcapsules may have a reflective finish forming composition for giving the observable image a reflective finish. The microcapsules may have a soft cured structure, an elastic cured structure, a rigid cured structure, etc. These types of microcapsules may be provided in a mixture, each type being attractive to a particular type of applied field, so that the observable image can be formed having a variety of unique appearances and physical structures.

Figure 9A:
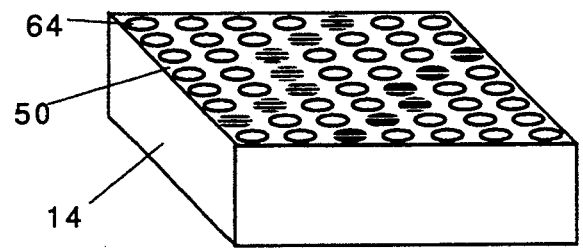
FIG. 9(a) is a perspective view of a portion of the locally variable attractive field plate showing pixels having a relatively weak additional applied field, pixels having a relatively strong additional applied field, and pixels with uniform or no applied field.
Figure 9B:
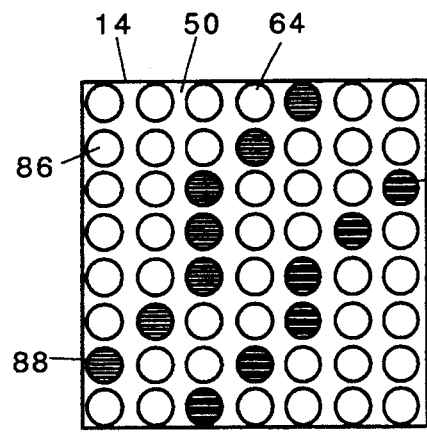
FIG. 9(b) is a front plan view of the portion of the locally variable attractive field plate shown in FIG. 9(a) showing the pixels having differing additional applied field strengths.
Figure 9C:
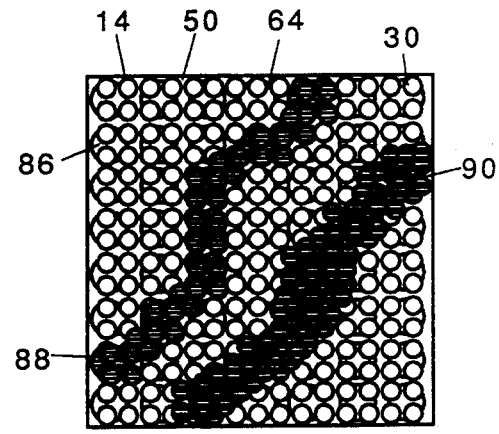
FIG. 9(c) is a front plan view of the portion of the locally variable attractive field plate showing the build up of a three-dimensional structure of microcapsules attracted to the differing applied field strengths.

Referring now to FIGS. 9(a) through 9(c), a portion of the locally variable attractive field plate 14 is shown in which each magnetically variable pixel (as shown for example in FIG. 5(a)) is comprised of the top surface of the core 64 of each individually controllable electromagnetic source 62. It is pointed out that this construction is for illustration only and that it is also representative of the electrostatically variable pixel and individually controllable electrostatic source shown in FIG. 5(b). As shown in FIGS. 9(a) through 9(c), the locally variable attractive field plate 14 has an operable surface 50 which includes a plurality of individually controllable attractive field sources, each in operable connection with a corresponding discrete location of the operable surface 50. In the embodiment shown in FIGS. 9(a) through 9(c), the top of the cores of individually controllable electromagnetic sources 62 act as magnetically variable pixels.

These magnetically variable pixels are equally spaced and the individually controllable electromagnetic sources 62 may be encased in a magnetically insulating material so that the influence of each individual magnetic pixel is limited to a magnetic end effect influence on its neighboring magnetic pixels. As shown more clearly in FIG. 9(b), some of the magnetically variable pixels have a uniform or no magnetic field 86. Others of the magnetically variable pixels have a relatively weak additional magnetic field 88, while still others of the magnetically variable pixels have a relatively strong additional magnetic field 90. It is noted that each of the magnetic pixels may be controlled so as to have a magnetic field strength which may be applied at a strength being anywhere from a maximum positive magnetic field, when a maximum current of one polarity is applied to the individually controllable electromagnetic source 62, to a zero magnetic field when no current is applied to the individually controllable electromagnetic source 62, to a maximum negative magnetic field when a maximum opposite polarity current is applied to the individually controllable electromagnetic source 62. In conventional terminology, the magnetic field may be described as north polar or south polar.

As shown in FIG. 9(c), when a uniform magnetic field is applied to the magnetically variable pixels, a uniform image forming microcapsule base layer 30 is formed. Alternatively, as discussed with regards to other Figures, this uniform image forming microcapsule base layer 30 may be formed by electrostatic attraction. The pixels having a relatively weak additional magnetic field 88 form a buildup of a three-dimensional structure of microcapsules which are attracted to the relatively weak magnetic field. The pixels which have a relatively strong additional magnetic field 90 have a buildup of a three-dimensional structure of microcapsules which are attracted to the relatively strong magnetic field. In accordance with the present invention, the number of microcapsules built up, and thus the ultimate dimensions of the topographical three-dimensional structure formed by the microcapsule buildup is dependent on the strength of the applied magnetic field applied through each of the magnetically variable pixels. Also, alternatively, the same structure may be provided by utilizing the electrostatically variable pixels shown in FIG. 5(b).

Figure 10:
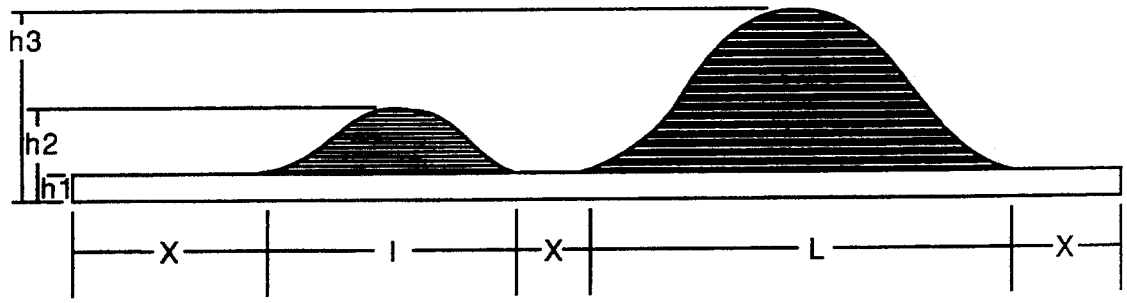
FIG. 10 is a diagram to explain the build up of a three-dimensional structure of microcapsules attracted to the attractive field variable pixels of the locally variable attractive field plate.

In FIG. 10, a comparison of dimensions of the buildup of the topographical three-dimensional structure of cured and developed microcapsules is shown. The portion of the final image along the lengths designated by X have a height h1 representing the uniform image forming microcapsule base layer 30. The topographical three-dimensional structure of microcapsules attracted to the relatively weak magnetic field along length 1 has a height h2 which is higher than h1. The topographical three-dimensional structure of microcapsules attracted to the relatively strong magnetic field along length L has a height h3, which is higher than both h2 and h1. Also, by varying the magnetic field between zero and a maximum, heights along a continuous spectrum may be built up of attracted microcapsules. Thus, it is possible to form a cured and developed image having a three-dimensional topographical structure as described previously which replicates, for example, the brush stroke 56" shown in FIGS. 2(b) and 2(c).

Figure 11A:
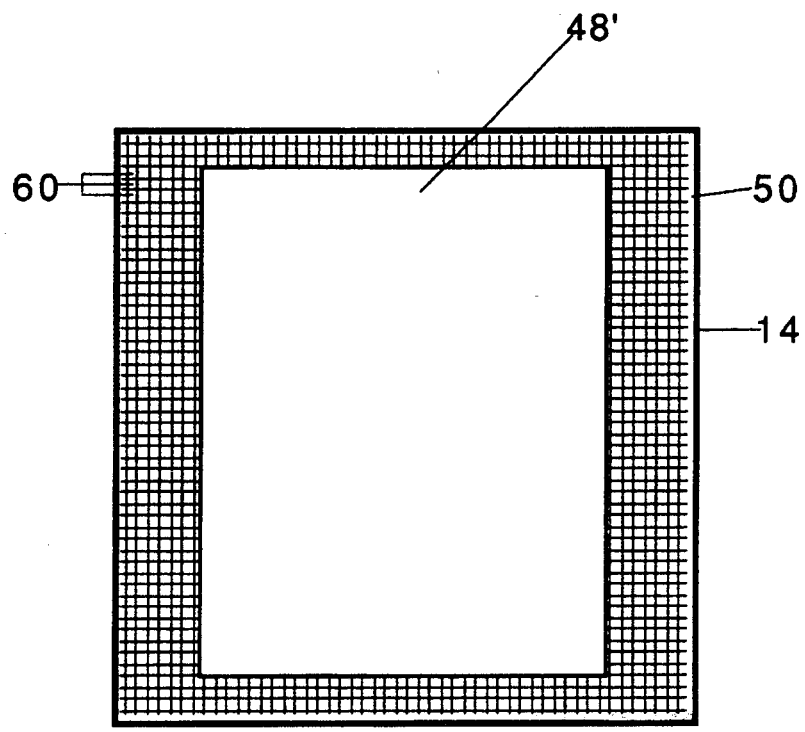
FIG. 11(a) is a plan view showing a recording sheet disposed on the locally variable attractive field plate.
Figure 11B:
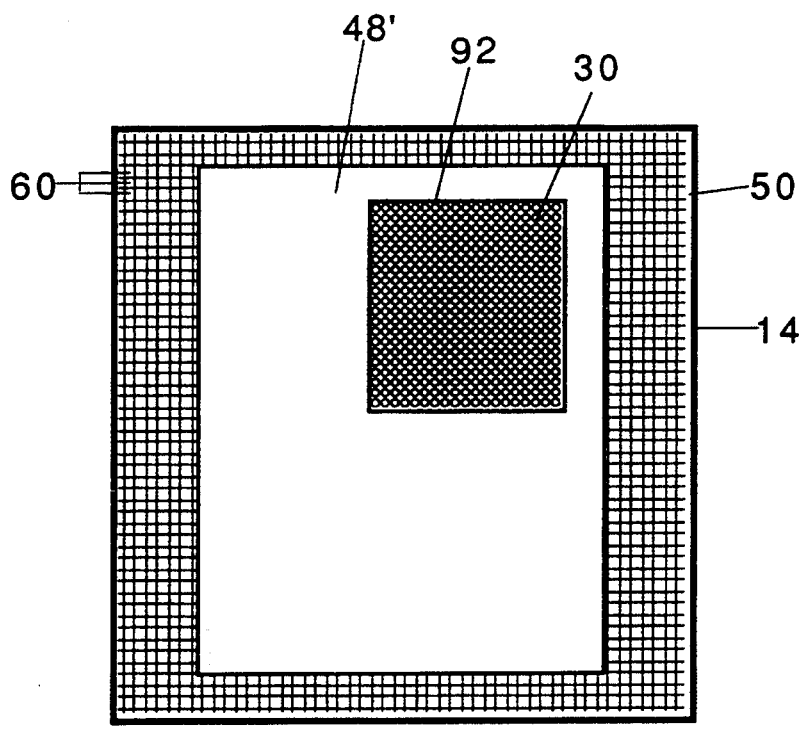
FIG. 11(b) is a plan view showing the recording sheet disposed on the locally variable attractive field plate showing a selected area for image formation and the formation of an image forming microcapsule base layer.

FIGS. 11(a) through 11(d) show a possible application of the inventive printer 10 for forming an image by image-wise exposure of a layer of chromogenic microcapsules. As shown in FIG. 11(a), a recording sheet 48' may be disposed against the operable surface 50 of the locally variable attractive field plate 14. This operable surface 50 has a plurality of equally spaced attractive field variable pixels 60. It is noted that the attractive field may be, for example, a magnetically variable attractive field or an electrostatically variable attractive field. As shown in FIG. 11(b), a selected area 92 for image formation (which corresponds to activated attractive field variable pixels 60 of the operable surface 50 of the locally variable attractive field plate 14) may be selected. Thus, by controllably activating these attractive field variable pixels 60 an image forming microcapsule base layer 30 may be formed. Alternatively, or in addition, a three-dimensional structure may be formed and, it is also possible that portions of the selected area 92 will remain free from the formation of a microcapsules layer, by for example, not applying any attractive field through the appropriate attractive field variable pixels 60.

Figure 11C:
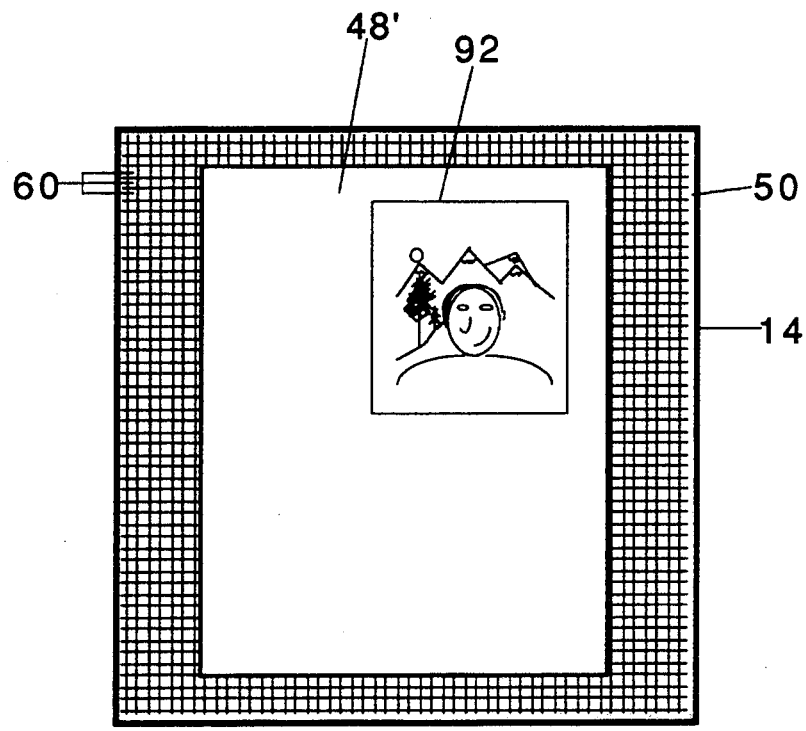
FIG. 11(c) is a plan view showing the recording sheet disposed on the locally variable attractive field plate having a developed and cured image disposed in the selected area for image formation.
Figure 11D:
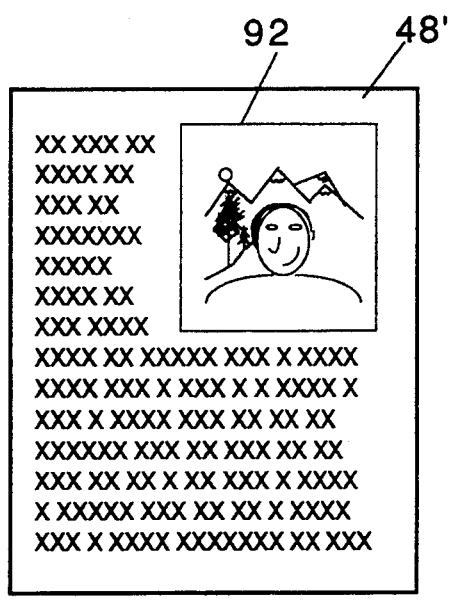
FIG. 11(d) is a plan view showing the recording sheet shown in FIG. 11(c) further having text or other images formed in addition to the developed and cured image disposed in the selected area for image formation.

As shown in FIG. 11(c), a developed and cured image may be formed in the selected area 92 for image formation through the use of the inventive apparatus as discussed herein. This developed and cured image may have the flat three-dimensional structure as shown in FIG. 2(e) or may have a topographical three-dimensional structure replicating the structure shown in FIG. 2(d). Either prior to, or after the formation of the image in the selected area 92 for image formation, text or images may be formed on the recording sheet 48' as shown in FIG. 11(d). Thus, a recording sheet 48' may be provided having an image with full color, three-dimensional structure, a glossy covering (depending on the type of microcapsule used) or the like, at one or more selected areas of the recording sheet 48' while other portions of the recording sheet 48' may have text or images formed using other printing methods, for example, laser printing, impact printing, thermal printing, or any other suitable printing method. In accordance with the present invention, it is possible to produce an image on a substrate which is transparent. Presently, when producing high-quality animation, a painstaking, labor intensive and time consuming method is used by which images are hand-painted by animation artists onto individual sheets (known as "cels"). Usually the sheet is made of a transparent material. About 30 cels per second of animation is required to obtain good results. This process is extremely expensive and inefficient. In accordance with the present invention, computer generated images may be disposed on a suitable substrate to form the cels. Thus, an animator can utilize the speed and efficiency of the computer to obtain a high-quality animation. The image can be formed by attracting microcapsules directly to the substrate prior to forming the latent image, by forming the latent image and than transferring the microcapsule layer to the substrate, by developing and curing the latent image into an observable image and then transferring the observable image to the substrate, etc.

In another application of the present invention, a high resolution movie film can be produced. Similarly with the production of animation "cels" described above, the present invention can be used to provide extremely large movie film for use with a film projector constructed to project the image on the large movie film. A conventional film projector projects light through a moving film having time sequential images disposed thereon. Time sequential images can be obtained and stored, either in digital form, or in analog form that is then digitized. A transparent recording sheet is then used to record a full color image using the inventive printer. By choosing an appropriate composition of the microcapsules, a projectable image can be disposed on the transparent recording sheet. A time sequential series of such images becomes a moving image projected onto an appropriate screen.

Also, when producing a reproduction of, for example, a photographic slide or other original which has dimensions inconsistent with that of a standard recording sheet (i.e. a sheet of paper), the original image has to be cropped or else an unsightly portion occurs on the reproduced observable image where the original does not expose the reproduction. The present invention can thus be utilized to provide a good looking reproduction by attracting microcapsules only to those portions of the recording sheet which coincide with the original image.

Figure 12A:
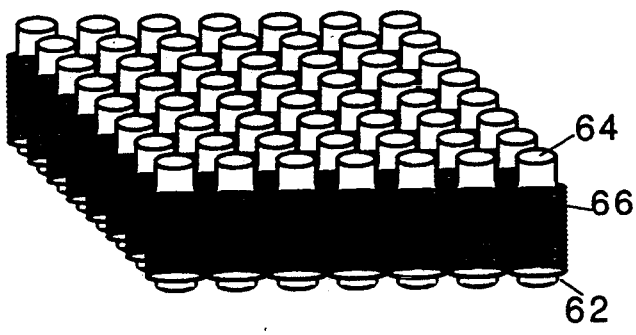
FIG. 12(a) is a perspective view showing a plurality of equally spaced individually controllable electromagnetic sources.
Figure 12B:
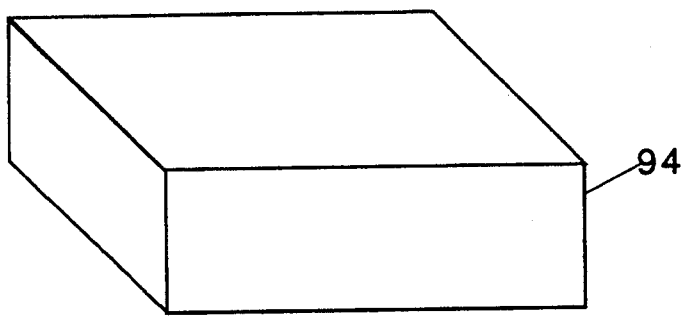
FIG. 12(b) is a perspective view showing a magnetically insulating material encasing the plurality of equally spaced individually controllable electromagnetic sources.

Referring now to FIGS. 12(a) through 12(d), the construction and a method of making the inventive locally variable attractive field plate 14 will be described. In this embodiment, the individually controllable attractive field sources are shown as the individually controllable electromagnetic sources 62 described in FIG. 4(a), and the magnetically variable pixels described in FIG. 5(a) are the tops of the cores of the individually controllable electromagnetic sources 62. First, a plurality of equally spaced individually controllable electromagnetic sources 62 are provided. Each individually controllable electromagnetic source includes a core 64, such as a ferromagnetic material, for example, iron, or a paramagnetic material, for example, aluminum, around which a winding 66 of an electrically conducted material, such as a metal wire is would. The leads from this winding 66 (shown in FIG. 4(a)) are attached to the varying means of the controlling means so as to apply a variable electric current to selectively vary the magnetic field strength at discrete locations of the operable surface 50 of the locally variable attractive field plate 14. As shown in FIG. 12(b), the plurality of individually controllable electromagnetic sources are encased in a magnetically insulating material 94, for example, a polymer which may have a magnetic absorbing material disposed therein. The tops of the cores 64 may be left exposed so that the tops of the cores 64 are flush with the top surface encasing of the magnetically insulating material 94, to provide the operable surface 50 (shown in FIG. 12(c)). Alternatively, the operable surface 50 may be prepared by, for example, planing the magnetically insulating material 94 until the tops of the cores of the plurality of individually controllable electromagnetic sources 62 is exposed. By this construction, the local magnetic effect of each core 64 is limited to an end magnetic effect on its neighboring cores 64.

Figure 12C:
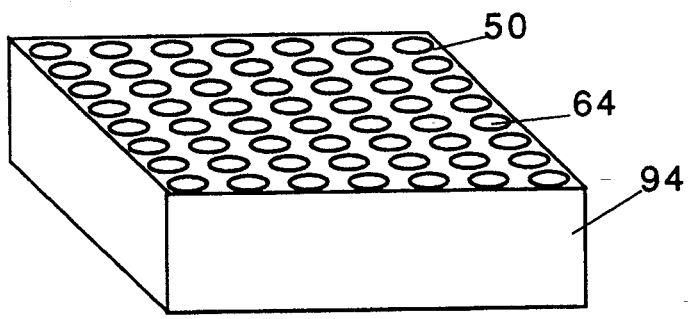
FIG. 12(c) is a perspective view showing the formation of the operable surface of a portion of the locally variable attractive field plate.
Figure 12D:
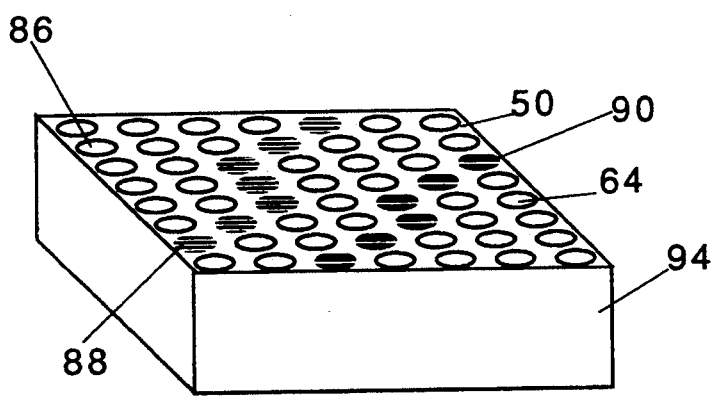
FIG. 12(d) is a perspective view of the portion of the locally variable attractive field plate shown in use.

FIG. 12(d) shows this portion of the locally variable attractive field plate 14 in use. As shown, some of the magnetically variable pixels have a uniform or no magnetic field 86 while others of the magnetically variable pixels have a relatively weak additional magnetic field 88 and still others of the magnetically variable pixels have a relatively strong additional magnetic field 90.

These pixels may have an applied magnetic field anywhere along a continuum from a negative maximum, through zero, to a positive maximum (or a maximum south pole field to a maximum north pole field).

Figure 13A:
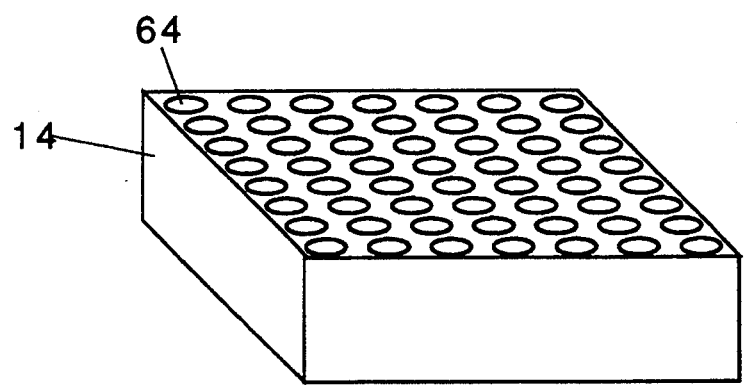
FIG. 13(a) is a perspective view of the portion of the locally variable attractive field plate showing the operable surface thereof.
Figure 13B:
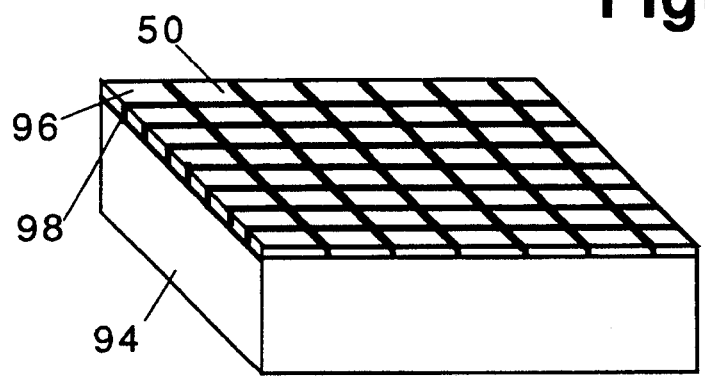
FIG. 13(b) is a perspective view of the portion of the locally variable attractive field plate showing the formation of a plurality of magnetically variable pixels.
Figure 13C:
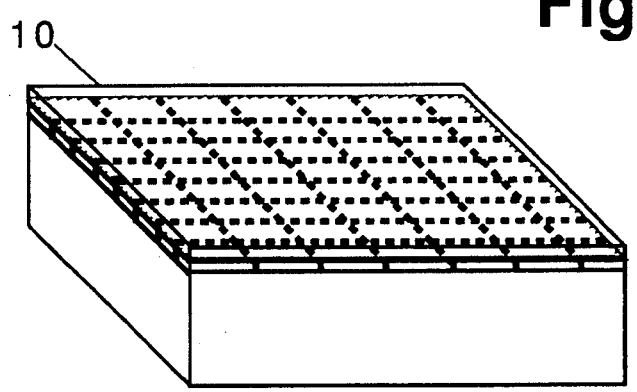
FIG. 13(c) is a perspective view of the portion of the locally variable attractive field plate showing the formation of an electrostatic conductive layer.
Figure 13D:
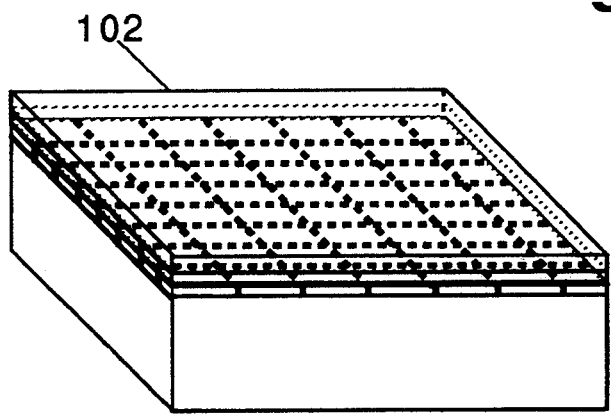
FIG. 13(d) is a perspective view of the portion of the locally variable attractive field plate showing the formation of a release layer.

FIGS. 13(a) through 13(d) show an alternative construction starting with the locally variable attractive field plate 14 shown in FIGS. 12(c) and 12(d). A magnetically permeable material 96 may be disposed at discrete locations over each of the cores of the individually controllable electromagnetic sources 62 so as to form the operable surface 50 of the locally variable attractive field plate 14. A magnetically impermeable material 98 (or the magnetically insulating material 94 may be disposed between the pixels of magnetically permeable material 96 (magnetically conductive material). These pixels may be formed by first depositing a uniform layer of magnetically conductive material on the top surface shown in FIG. 13(a) and then etching the pixels using a selective etching method. Next, a magnetically insulating material may be deposited either through a mask, or uniformly deposited and then etched, so that the operable surface 50 is formed wherein the magnetically attractive pixels are separated by magnetically insulating material. Thus, the localized effect of induced magnetic fields is controlled and only a magnetic end effect problem exists, allowing the magnetic field of one pixel to have a limited effect on the magnetic field of another pixel that is its neighbor. Thus, the resolution of the ultimate image formed by the inventive printer 10 is enhanced and finer detail may be provided in both the observable image and the three-dimensional topographical structure thereof. As shown in FIG. 13(c), an electrostatic layer 100 may be provided as a uniform layer so as to be available to form the image forming microcapsule base layer 30 as described in detail herein with reference to FIG. 1. This electrostatic layer 100 should preferably be relatively thin and may comprise a para-magnetic material such as aluminum or composition thereof, so that the effect of the local magnetic fields from the individual magnetic pixels does not excessively become spread out. Also, the electrostatic layer 100 may be composed of a material having opto-electrical properties. As shown in FIG. 13(d), a release layer 102, such as Teflon, may be provided to prevent sticking of a cured image to the operable surface 50. Thus, a support structure such as a recording sheet 48' shown in FIG. 1, does not have to be used. The image may be formed and supported only in the melted and cured microcapsule shells and/or internal phase. This image can then be transferred onto a carrier substrate (such as the recording sheet 48'). Furthermore, in accordance with the present invention, to facilitate the release of the cured image, the magnetic field of the magnetic pixels may be reversed so as to repel the cured image. The magnetic material in the microcapsules which become the cured image may be imparted with a permanent magnetic field strength due to the induced magnetization of the magnetic composition of the microcapsules. Then, by applying a strong reversed polarity magnetic field, the cured and developed image will be repelled from the operable surface 50 of the locally variable attractive field plate 14.

Referring to FIGS. 14(a) through 14(c), a magnetic brush 104 of an inventive input device in accordance with the present invention is shown. The magnetic brush 104 includes a handle having disposed at one end a magnetic field source 106. In this embodiment, the magnetic field source 106 includes a plurality of bristles, which may be comprised of magnetic or magnetizable material. In this embodiment, the bristles are made of a magnetic conductive material which are effective for conducting a magnetic field along the length of the bristles supplied by the magnetic field source 106. The magnetic field source 106 may include an electromagnet to provide a controllable electromagnetic field, or a permanent magnet. The bristles may be made from, for example, a ferromagnetic material such as iron, or a para-magnetic material such as aluminum, or any other suitable magnetic material.

Figure 14D:
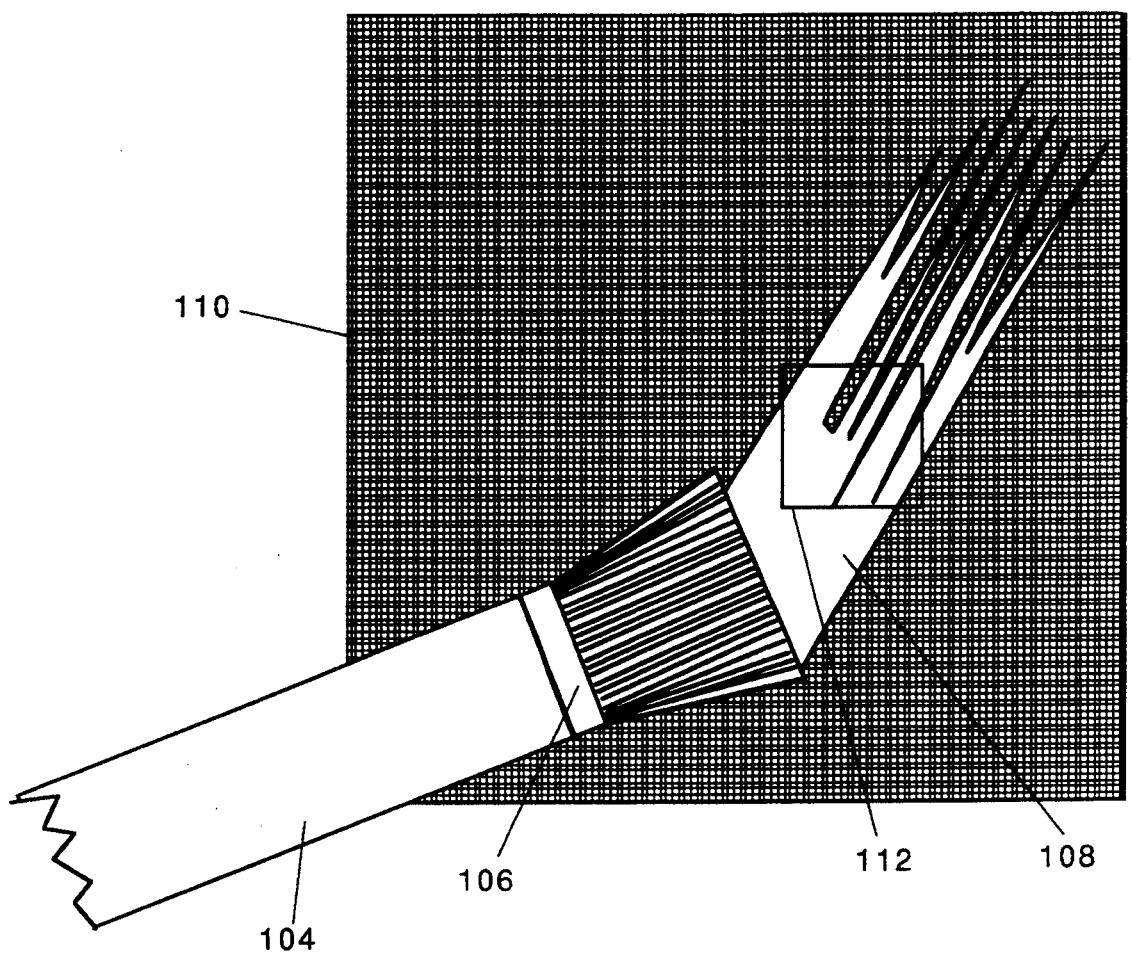
FIG. 14(d) is a plan view of the magnetic brush forming a magnetic brush stroke over a magnetic detecting plate of the inventive input device.
Figure 14E:
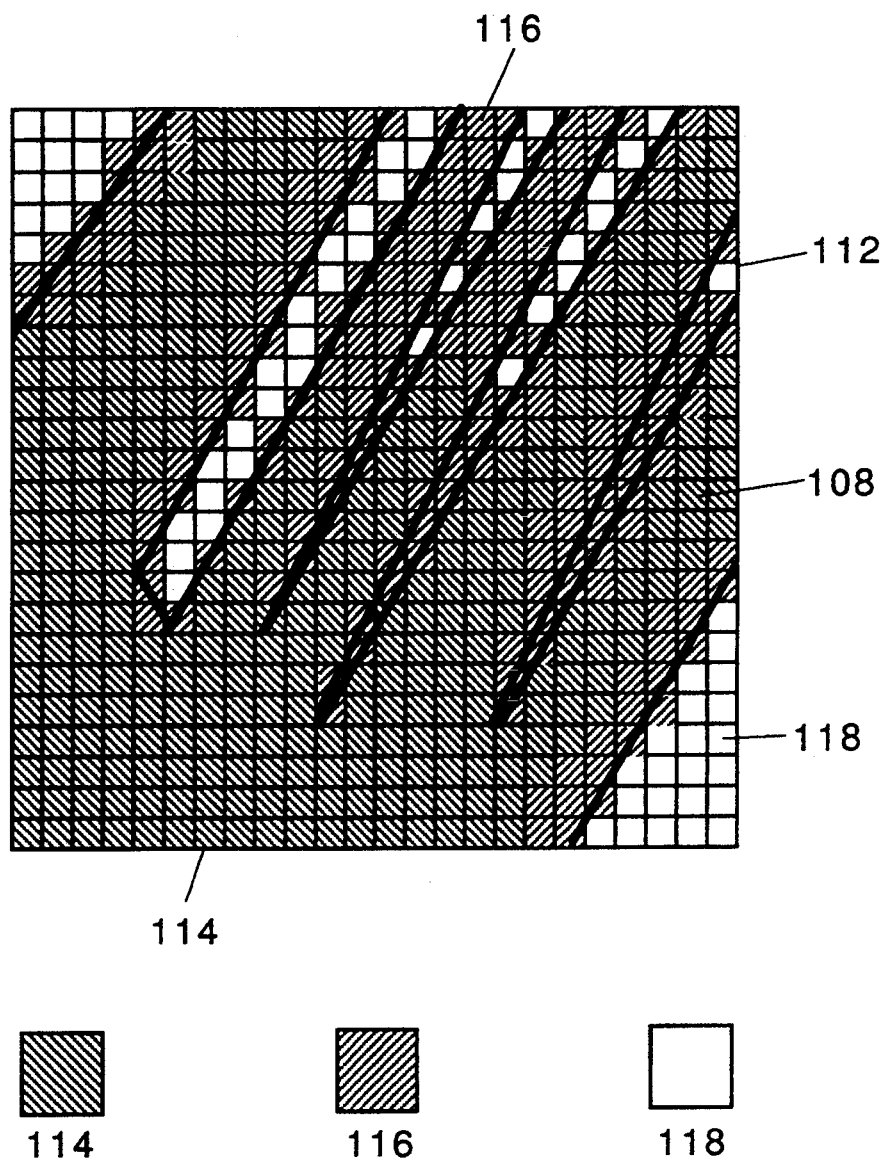
FIG. 14(e) is an enlarged view of a portion of the magnetic detecting plate shown in FIG. 14(d) showing the relative magnetic field strength from the magnetic brush stroke.
Figure 15A:
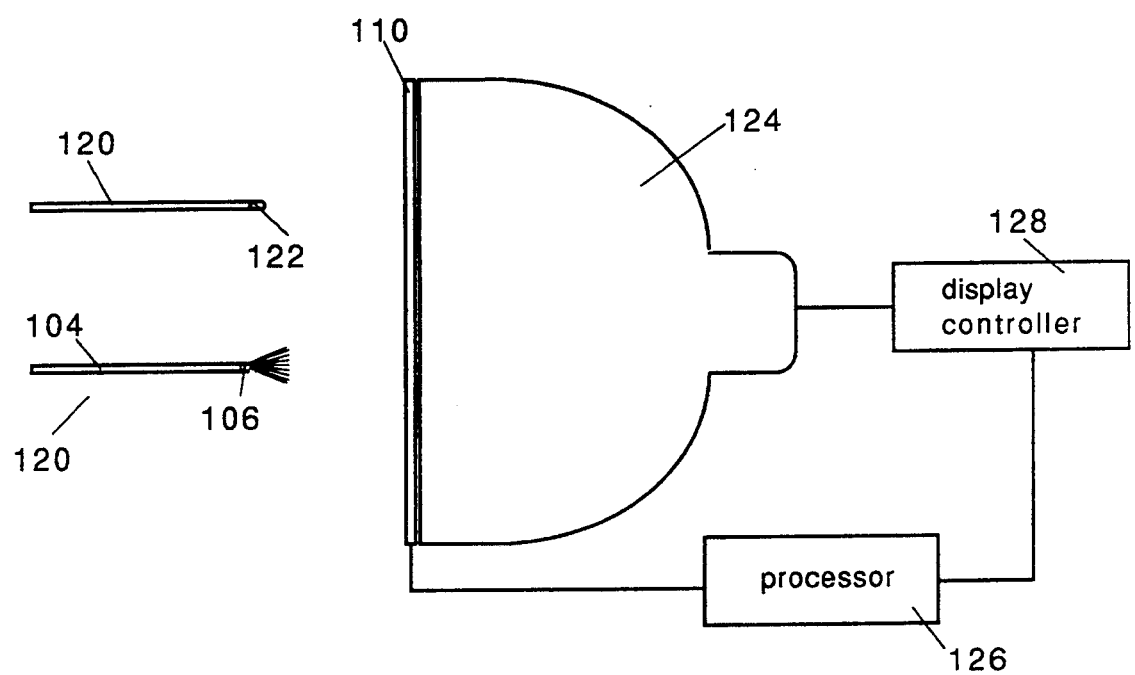
FIG. 15(a) is a schematic representation of the input means in accordance with the present invention showing a magnetic field applier, magnetic detecting plate, and image projection device.

As shown in FIG. 14(b), a magnetic brush stroke 108 is formed by drawing the bristles over a portion of a magnetic detecting plate 110 (shown in FIGS. 14(d), 14(e), and 15(a)). The magnetic brush stroke 108 may be defined by a three-dimensional topographical structure representative of a corresponding magnetic field strength along the surface of the magnetic brush stroke 108. As shown in FIG. 14(c), which is an imaginary cross section along line I—I of FIG. 14(b), the three-dimensional topographical structure is comprised of a plurality of peaks and valleys which change in height depending on a corresponding magnetic field strength provided by the bristles as the bristles are drawn across the magnetic detecting plate 110 leaving the intended magnetic brush stroke 108.

FIG. 14(d) shows the magnetic brush 104 being drawn across the surface of the magnetic detecting plate 110 so as to form the magnetic brush stroke 108. This magnetic brush stroke 108 is detected by the magnetic detecting plate 110 as discussed in detail herein. If the magnetic field source 106 is comprised of a variable electromagnet, then the relative strength and thus the representative dimensions of the magnetic brush stroke 108 as it is being drawn over the surface of the magnetic detecting plate 110 can be further selectively varied. Also shown in FIG. 14(d) is a portion 112 of the magnetic detecting plate 110 over which has been drawn the bristles of the magnetic brush 104. This portion 112 of the magnetic detecting plate 110 is shown in enlarged detail in FIG. 14(e).

Referring now to FIG. 14(e), an enlarged view of the portion 112 of the magnetic detecting plate 110 illustrating the relative field strengths from the magnetic brush stroke 108 is shown. As shown by the solid lines, the magnetic brush stroke 108 forms "fingers" which correspond with a conventional brush stroke 56" where the thickness of the layer of paint 56' left by the bristles of the conventional brush 56 varies so as to form the three-dimensional structure (see the cross section shown in FIG. 2(d)). Similarly, the bristles of the magnetic brush 104 being dragged across the surface of the magnetic detecting plate 110 is represented by varying magnetic field strengths detected by the individual pixels of the magnetic detecting plate 110. The pixels of relatively strong detected magnetic field strength 114 correspond to locations where the bristles, if from a conventional brush 56, would have left a relatively thick layer of paint 56'. The pixels of relatively weak detected magnetic field 116 correspond to locations where the bristles, if from a conventional brush 56, would have left a relatively thin layer of paint 56'. The pixels of no detected magnetic field 118 represent areas where the bristles, if from a conventional brush 56, would have left no paint 56'. Thus, by detecting the relative strengths using the individual pixels of the magnetic detecting plate 110, a three-dimensional profile, as shown in FIG. 14(c) may be detected along the surface of the magnetic brush stroke 56". It is noted that the relative size of the magnetic detecting pixels does not necessarily have to be as small as the attractive field variable pixels 60 of the locally variable attractive field plate 14 since the image resolution will mostly be dependent on the microcapsules size and is therefore, relatively less dependent on the size of the magnetic field detecting pixels of the magnetic detecting plate 110.

As shown in FIG. 15(a), a schematic representation of the inventive input means is shown. The inventive input means includes a magnetic field applier 120, which may be a magnetic pen 122 having a magnetic head, which may be either of a permanent magnet or electromagnet having a variably controlled magnetic field strength. Alternatively, as described with reference to FIGS. 14(a) through 14(e) above, the magnetic field applier 120 may be comprised of a magnetic brush 104 having magnetic bristles which may be permanent magnets themselves, which may conduct a magnetic field from a permanent magnet included in the magnetic field source 106, or which may conduct a magnet field from a variable electromagnet included in the magnetic field source 106. A magnetic detecting plate 110 is preferably disposed in front of an image projection device 124. The image projection device 124 may be a CRT, LCD, LED, or any other suitable image projection means. The magnetic detecting plate 110 provides input to a processor 126 which sends process signals to a display controller 128. The display controller 128 controls the image projection device 124 so that a user can view a corresponding magnetic brush stroke 108, or stroke of the magnetic pen, in real time. Furthermore, unlike a conventional input device, such as a mouse, tablet or keyboard, the user, using the inventive magnetic detecting plate 110, can see the user's input image at a location which directly corresponds with the location at which the image is being input.

Figure 15B:
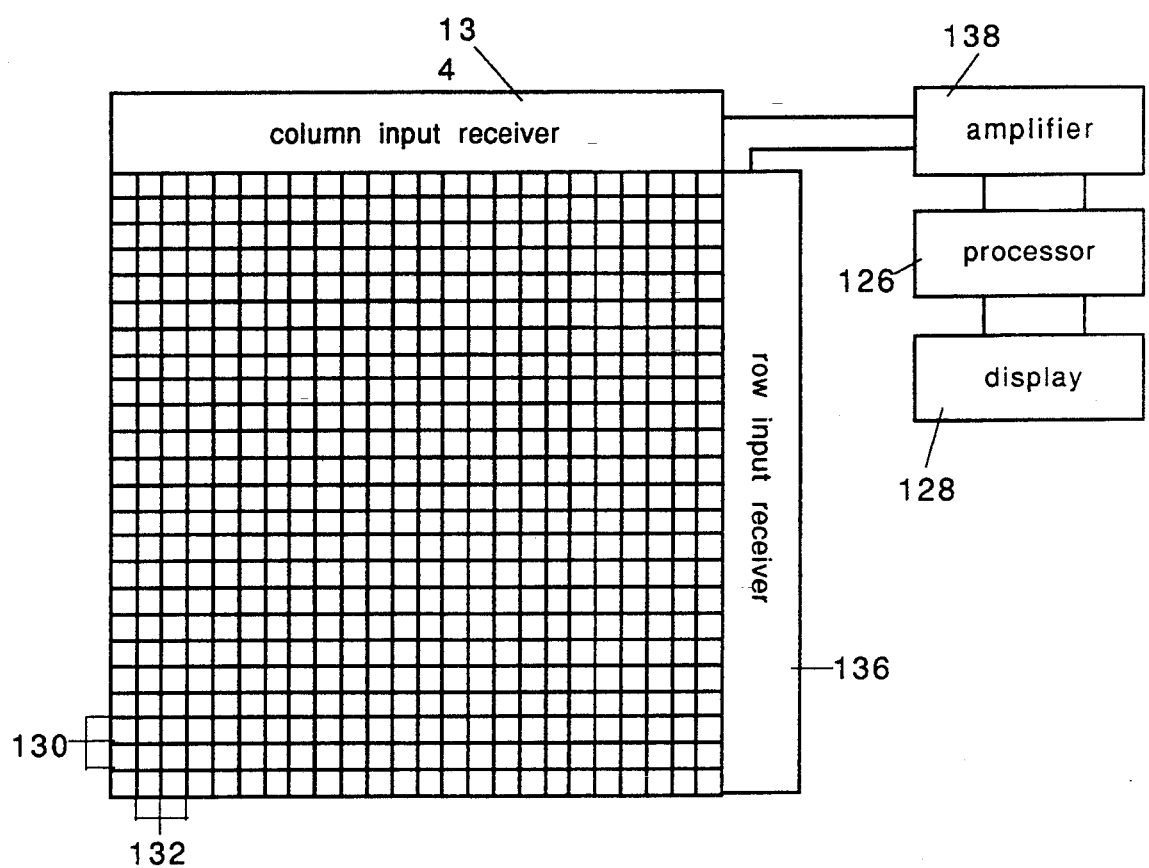
FIG. 15(b) is a plan view of the magnetic detecting plate showing input processing means.

As shown in FIG. 15(b), the magnetic detecting plate 110 is comprised of a plurality of intersecting X electrodes 130 and Y electrodes 132 which form discrete pixels. As a magnetic source is drawn over the electrodes making up the pixels, an induced current is generated in the electrodes 130 and 132. This induced current may be detected by detectors (not shown) which output to a column input receiver 134 and a row input receiver 136, respectively, so that the intersection, and hence the location of an applied magnetic field from the magnetic field applier 120 can be detected. The signals from the column input receiver 134 and the row input receiver 136 are amplified by an amplifier 138 and a signal dependent on of the relative strength at each intersection receiving the magnetic field is sent to the processor 126. This information is processed by the processor 126 to determine, for example, where and how thick or wide a magnetic brush or open stroke is. The processor 126 sends processed signals to the display controller 128 so as to be effective to directly display (or indirectly) the image being input by the magnetic field applier 120 on the magnetic detecting plate 110. Preferably, the plurality of intersecting X electrodes 130 and Y electrodes 132 comprise a transparent electrical conductor, for example, ITO (or any other suitable electrically conductive electrode in which an induced electric current may be generated). Also, preferably, the electrodes are insulated from each other so that the influence of each electrode's induced electric current is minimized. This induced current is detected and used to determine the position and relative strength of the intended image formed by the magnetic field applier 120.

Referring to FIGS. 16(a) through 16(d), a method of forming an image having a three-dimensional topographical structure in accordance with the present invention is shown. A structure of microcapsules 138 is built up on the locally variable attractive field plate 14 so as to form structures having, for example, a three-dimensional structure 140 of microcapsules attracted to individually variable pixels having a relatively weak additional magnetic field, and a three-dimensional structure 142 of microcapsules attracted to individually variable pixels having a relatively strong magnetic field. In this embodiment, the microcapsules are thermal expansive and may be thermally expanded (FIG. 16(b)) through the application of heat.

Figure 16A:
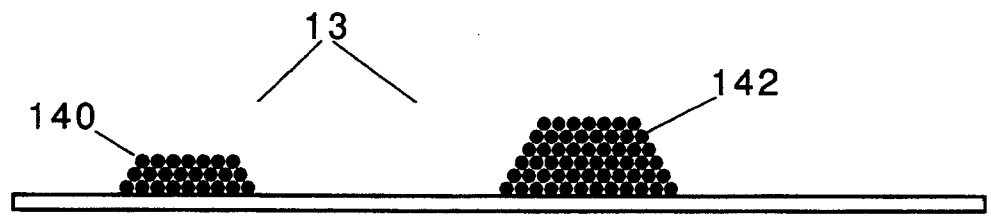
FIG. 16(a) is a schematic representation showing the build up of a three-dimensional structure of attracted microcapsules.
Figure 16B:
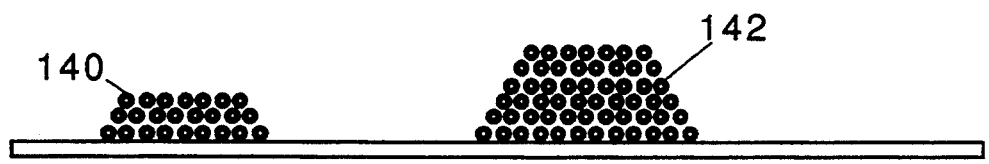
FIG. 16(b) is a schematic representation of the build up of a three-dimensional structure of microcapsules being thermally expanded.
Figure 16C:
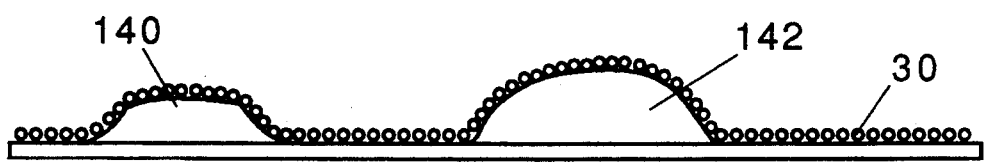
FIG. 16(c) is a schematic representation of an image forming microcapsule base layer formed over a cured three-dimensional structure built up of microcapsules.

Thus, a three-dimensional base structure is formed over which, as shown in FIG. 16(c), an image forming microcapsule base layer 30 may be provided. This image forming microcapsule base layer 30 may be provided by either of electrostatic attraction or magnetic attraction of a plurality of microcapsules. The three-dimensionally base structure 140 and 142 may be .formed by fully thermal expanding the microcapsules, and in the case of heat meltable microcapsules, heat melting the microcapsule wall to form a melted three-dimensional base structure. Alternatively, the microcapsules may be left unheated or partially heated until the final curing of the image forming microcapsules.

Figure 16D:
FIG. 16(d) is a schematic view of a developed and cured image formed over a cured three-dimensional base structure.

As shown in FIG. 16(d), the developed and cured image may be formed as a top surface layer over the three-dimensional structure base layer. Thus, an image having a three-dimensional structure may be provided. The microcapsules which form the three-dimensional base structure may be magnetically or electrostatically attractive microcapsules which may be opaque and used just to form the three-dimensional base structure. These magnetic or electrostatically attractive microcapsules may also be photosensitive, may be thermal expansive, or a combination of any or all three of these attributes. The image forming microcapsule layer may be formed after the formation of the three-dimensional structure. Also, since the material used to form the three-dimensional structure is magnetically and/or electrically conductive, the image forming microcapsule layer may be formed by electrostatic deposition, magnetic deposition, spraying, or any other suitable microcapsule layer formation method.

Figure 17A:
FIG. 17(a) is a schematic representation showing the formation of an image forming microcapsule base layer.
Figure 17B:
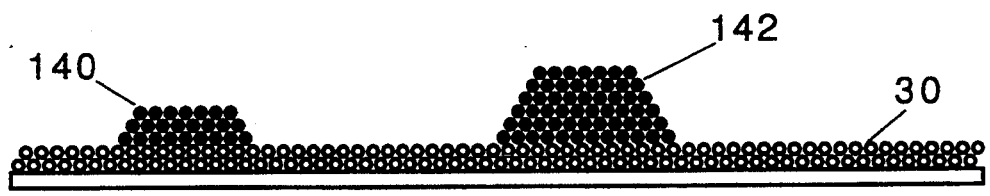
FIG. 17(b) is a schematic representation showing the image forming microcapsule base layer having a three-dimensional structure of microcapsules built up upon it.
Figure 17C:
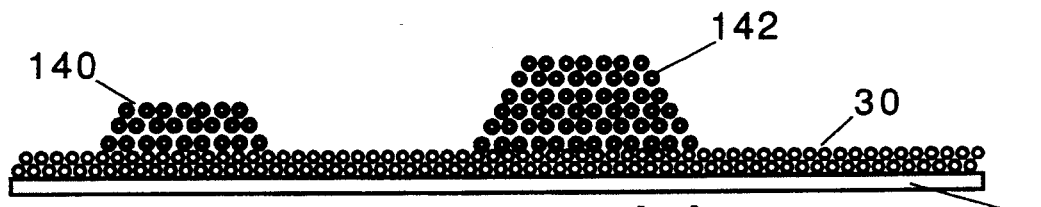
FIG. 17(c) is a schematic representation of the image forming microcapsule base layer having a thermally expanded microcapsule three-dimensional structure built up on it.
Figure 17D:
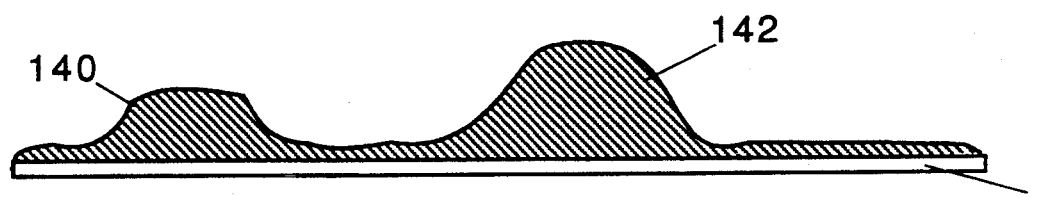
FIG. 17(d) is a schematic representation of a developed and cured three-dimensional image formed in accordance with the present invention.

Referring to FIG. 17(a) through 17(d), in accordance with the utilization of the present invention, an image forming microcapsule base layer 30 may be first formed on either of the operable surface 50 of the locally variable attractive field plate 14 or a recording sheet 48' disposed thereon. Over this image forming microcapsule base layer 30 may be formed a three-dimensional structure 140 and 142 of microcapsules, either by electrostatic attraction or magnetic attraction, by individually controllable attractive field pixels as described herein. This three-dimensional structure 140 and 142 may be built of microcapsules which are, for example, thermal expansive, heat meltable, and/or photo sensitive to specific wave lengths of electromagnetic radiation. As shown in FIG. 17(c), in the case of thermally expansive microcapsules, the thermal expansive microcapsules may be thermally expanded, either partially or fully. If partially expanded, the image forming microcapsule base layer 30 and the partially expanded three-dimensional structure forming microcapsule layers may be image-wise exposed to electromagnetic radiation 40 to form a latent image. Otherwise, the image forming microcapsule base layer 30 should be image-wise exposed prior to the melting of the three-dimensional structure microcapsules. As shown in FIG. 17(d), the cured and developed image has a three-dimensional structure, which may replicate, for example, a conventional painting 52, the bumps of the braille alphabet, raised lettering of letterhead, or any other suitable application.

Figure 18A:
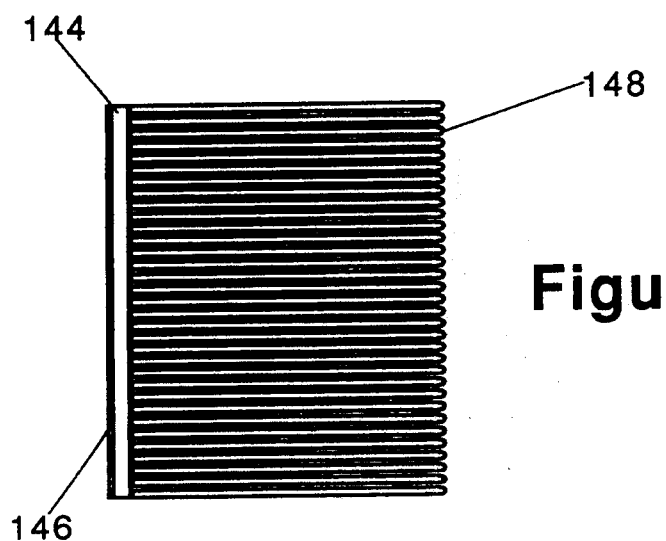
FIG. 18(a) is a side view of an embodiment of the attractive field member, showing fiber optic light directors for directing light to impinge on an optomagnetic coating applied on a transparent substrate.

Another embodiment of the inventive printer for forming an image in a layer of microcapsules will now be described. As shown in FIG. 18(a), image receiving means is provided for receiving an image in a layer of field attractive microcapsules 24. The image receiving means comprises a locally variable attractive field member, which includes a glass plate substrate 144 having an optomagnetic coating 146 disposed thereon. An information light source comprises, for example, a bundle of fiber optic cables 148 are used to carry light information, and each form an individual fiber optic pixel. The ends of the individual fibers can be fused together to create the glass plate substrate, or to create a structure which is supported by the glass plate substrate 144. Furthermore, the optomagnetic coating 146 may alternatively be an optoelectric coating 146 which generates a uniform or varied electrostatic attractive field to attract electrostatic attractive microcapsules 24. By varying the spatial relation and the intensity of light information directed through the fiber optic cable bundle, the optomagnetic or optoelectric coating 146 becomes attractive so that it is able to attract field attractive microcapsules 24 on selected portions of the attractive field member. In accordance with the present invention, controlling means is operationally connected with the information light source for controlling the locally variable attractive field member to selectively apply an attractive field at locations of the locally variable attractive field member so that a layer of field attractive microcapsules 24 can be formed by selectively applying a local attractive field member.

Figure 18B:
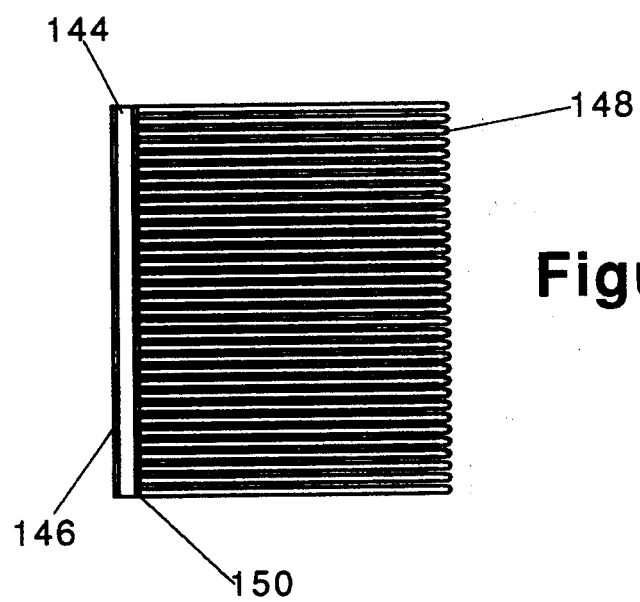
FIG. 18(b) is a side view of the embodiment shown in FIG. 18(a), in which the attractive field member further includes a phosphor coating.
Figure 18C:
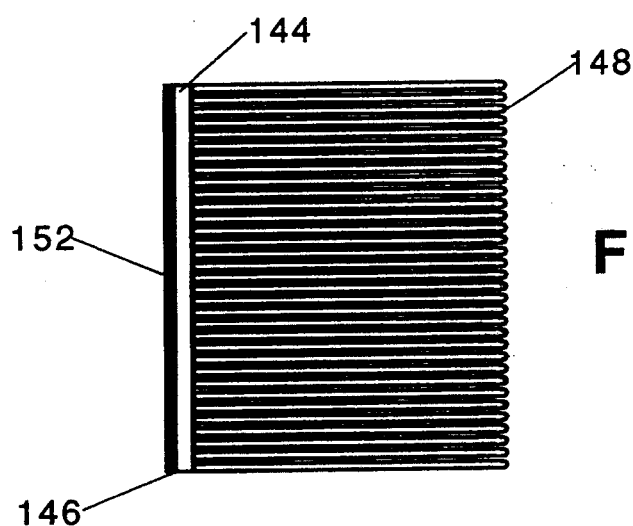
FIG. 18(c) is a side view of the embodiment shown in FIG. 18(b), further comprising a light shielding layer.

In the embodiments shown in FIG. 18(a)-18(c), the controlling means includes the ends of the fiber optic bundle, and is effective to control the strength of attraction of the attractive field member by applying light information impinging on selected locations of the optomagnetic coating 146, so that an attractive field is applied at locations of the attractive field member. When excited by impinging light, the optomagnetic coating becomes magnetically attractive by which magnetically attractive microcapsules are disposed on the attractive field member.

As shown in FIG. 18(a)-18(c), a light beam is directed through the length of the fiber optic cables to impinge on the optoelectric and/or optomagnetic coating 146 to generate a magnetic field and/or an electrostatic field, for applying a respective attractive field at corresponding discrete locations of the optoelectric and/or optomagnetic coating 146. Both an optomagnetic and an optoelectric coating 146 may be applied so that, for example, a full color image can be produced by selectively attracting magnetically attractive microcapsules 24, an then text may be produced by selectively attracting electrostatically attractive field capsules (or vice-versa). In this case, the text producing microcapsules 24 may be, for example, only black chromogenic microcapsules 24 to produce text by the electrostatic attraction of these microcapsules 24 to the portions of a recording sheet, such as sheet of paper, at which text will be produced. Thus, full color printing and crisp text can be mixed on the same sheet of paper. Also, microcapsules 24 having different compositions can be selectively electrostatically and magnetically attracted to produce a number of effects. For example, depending on its attractive composition, thermal expansive microcapsules 24 (or any other quality specific type of microcapsule 24 such as, but not limited to, those described herein) can be selectively electrostatically (or magnetically) attracted to produce their specific quality. In the case of thermal expansive microcapsules 24, the specific quality is expanding to produce raised images, such as bumps (such as Braille), and texture (such as paint simulating brush strokes), on selected portions of the sheet of paper.

The light information source may be a phosphor coating 150 which emits light in response to an impinging electron beam. The phosphor coating 150 can comprise a black and white phosphor screen to provide high contrast, and gray shading, to vary the optomagnetic and optoelectric effect. A color producing phosphor screen can be used to impart color information, which will have varying effects depending on the attributes of the optoelectric, optomagnetic coating 146.

In the embodiment shown in FIG. 18(c), a light shielding layer 152 can be used to prevent unwanted exposure of microcapsules 24 by light information used to control the strength of attraction of the attractive field member. As an alternative, the optomagnetic layer and chromogenic material of the microcapsules 24 can be reactive to different wavelengths of light, to prevent premature exposure of the chromogenic material.

Figure 19A:
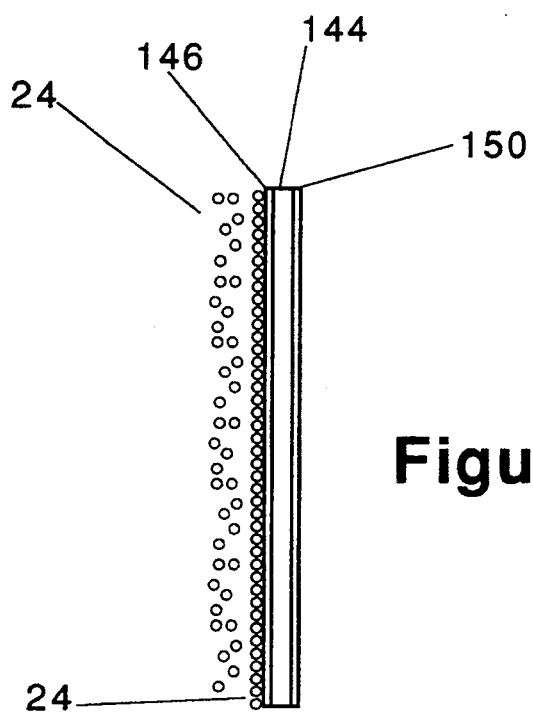
FIG. 19(a) is a side view of the attractive field member attracting a uniform layer of microcapsules having a flat topography.
Figure 19B:
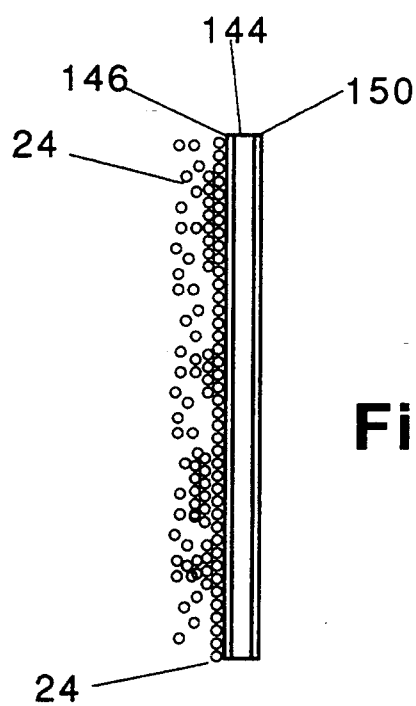
FIG. 19(b) is a side view of the attractive field member attracting a non-uniform layer of microcapsules having a varied topography.

Referring now to FIG. 19(a), an even intensity and/or wavelength can be applied to impinge on the optomagnetic coating 146, so as to provide a uniform magnetic field resulting in a uniform layer of microcapsules 24 having a flat topography. Also, to produce various effects such as, disposing an image at a discrete location on the recording sheet while leaving the rest of the recording sheet bare, forming a three-dimensional topographical image, or buildingup a composite image on a recording sheet by selectively forming images at various discrete locations in a series of image forming steps, a varied intensity and/or wavelength of light can be applied to impinge on the optomagnetic coating 146, so as to form a nonuniform magnetic field resulting in a non-uniform layer of microcapsules 24 having a varied topography.

Figure 20A:
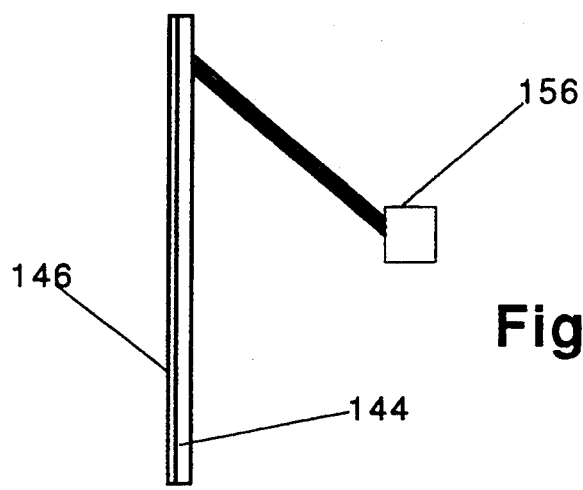
FIG. 20(a) is a side view of an embodiment of the attractive field member showing a scanning laser used to write information on an optomagnetic coating.
Figure 20B:
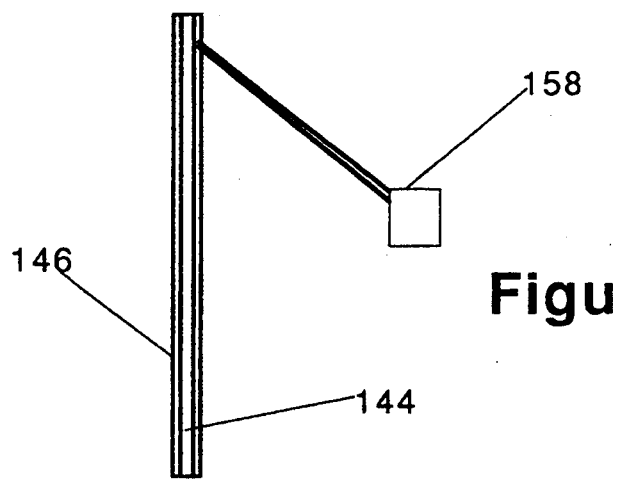
FIG. 20(b) is an embodiment of the attractive field member, showing a scanning electron gun used to write information on a phosphor coating.

As shown in FIG. 20(a), a scanning laser from a laser source 156 can be used to write information in the optomagnetic coating 146 on the glass substrate 144. The scanning laser can be pulse modulated to selectively write information on the optomagnetic coating 146 at selected discrete locations. As shown in FIG. 20(b), a scanning electron gun 158 can be used to write information onto a phosphor coating 150. In this case, the scanning electron gun 158 can be scanned using conventional magnetic field techniques, such as that used for a conventional cathode ray tube. The phosphor screen thus produces an emission of light which impinges on the optomagnetic or optoelectric coating 146 and produces an optomagnetic and/or electrostatic effect at selected discrete locations of the attractive field member, so as to form a desired unexposed latent image forming layer attractive microcapsules 24.

Figures 20C, 20D:
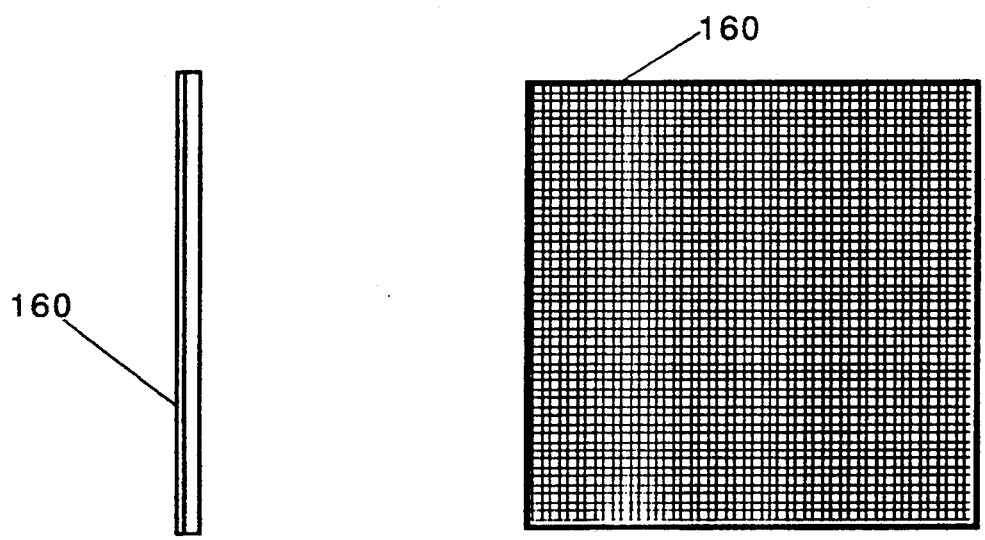
FIG. 20(c) is a side view of an embodiment of the attractive field member, having an LCD matrix, or matrix of diode lasers, used to write information on an optomagnetic coating.
FIG. 20(d) is a front view of the attractive field member shown in FIG. 20(c)

As shown in FIGS. 20(c) and 20(d), an LCD matrix 160, or matrix of diode lasers, can be used to write information to the optomagnetic and/or optoelectric coating 146. In the case of the LCD matrix 160, back lighting may be provided which is spatially modulated by the light valving of the LCD matrix 160. The LCD matrix 160 or the matrix of diode lasers (or LEDs) can be provided using the known techniques for forming such devices. Also, it is anticipated that alternative embodiments will become available for producing a spatially modulated light image by which the optoelectric, optomagnetic coating 146 can become locally variably field attractive. Such future developments, therefore, fall within the scope of the present invention.

Figure 21:
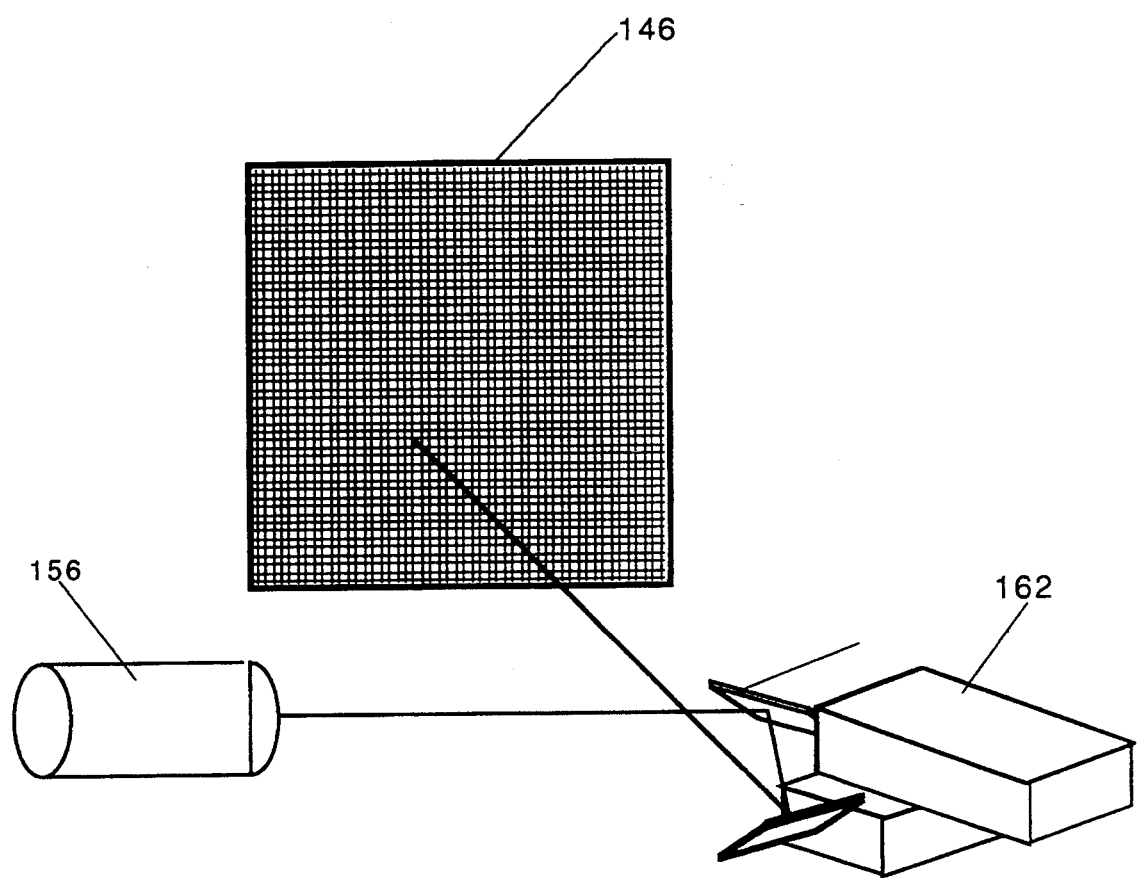
FIG. 21 shows an embodiment in which galvanoscanners are used to scan a laser beam over the attractive field member.

FIG. 21 shows an alternative embodiment in which a laser source 156 produces a laser beam which is scanned over a optomagnetic and/or optoelectric coating 146 on an attractive field member, using galvanoscanners 162. To improve the contrast, and to provide a separation of the discrete locations (i.e. pixels) on the attractive field member, the optomagnetic and/or optoelectric coating 146 may be formed into pixels. By etching the coating 146 into discrete pixels, the individually induced fields of each individual pixel will be more contained within the area of the separated pixels, so as to decrease the influence on neighboring pixels caused by the field induced in each individual pixel. Etching of the coating may be accomplished using known masking/selective etching techniques, such as those employed in printed circuit manufacture. The laser beam may be pulse modulated to carry spatial image information. The galvanoscanners 162 are used to direct this pulse modulated laser beam to positions on the attractive field member to form a latent image. Thus, a locally varied attractive field may be produced by which attractive microcapsules 24 are formed into either a uniform layer having a flat topographical structure, or a non-uniform layer having a varied topographical structure. A latent image producing attractive field (such as individual letters of texts or elements of a graphic image) can be produced by controlling the scanning of the laser beam.

Figure 22:
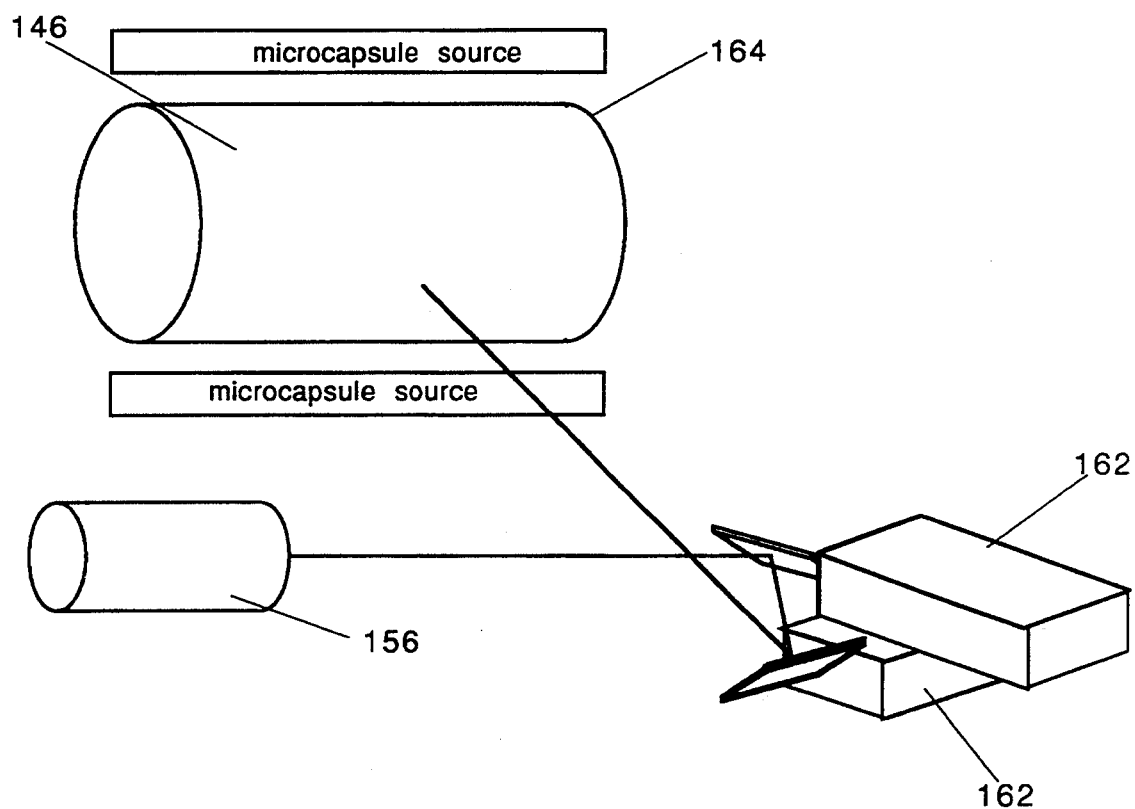
FIG. 22 is an embodiment showing the attractive field member configured as a rotating drum.

FIG. 22 shows an embodiment in which the attractive field member is configured as a rotating drum 164. The operational surface of rotating drum 164 is coated with an optoelectric and/or optomagnetic coating 146, and one or more laser beam is scanned one line or more at a time across the surface of the rotating drum 164 so as to form an attractive field. In the case of multiple laser beams, the separate beams can be modulated to apply spatial light information. Also, one or more lines of fiber optic cables 148 can be used to direct light onto the rotating drum 164. Alternatively, an electron beam can be used to produce the varied attractive field.

Figure 23A:
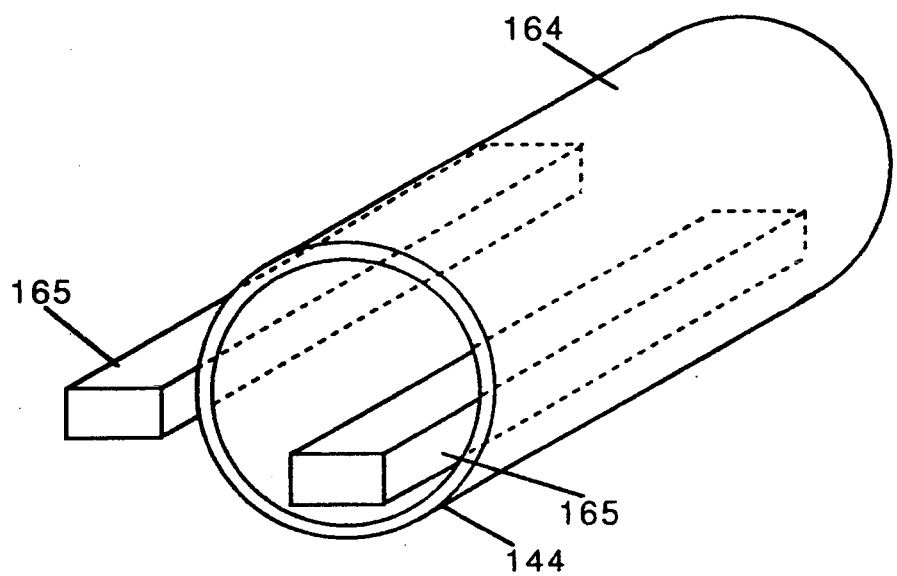
FIG. 23(a) is a perspective view showing an embodiment in which a attractive light source is disposed inside a hollow rotating drum.

As shown in FIG. 23(a), the attractive field member configured as a rotating drum 164 may also be hollow and comprise, for example, a transparent substrate 144. An information carrying light source, such as one or more lines of fiber optic cables 148, a cathode ray tube, a matrix of liquid crystal light valves (or other spatial light modulator) a matrix of LEDs of diode lasers, or other information carrying lighting source, is disposed inside the hollow drum 164 at a position effective to radiate the optoelectric and/or optomagnetic coating 146 disposed on the hollow rotating drum 164. Light information passes through transparent drum 164 substrate 144 and causes the optoelectric and/or optomagnetic coating 146 to become locally variably attractive.

Figure 23B:
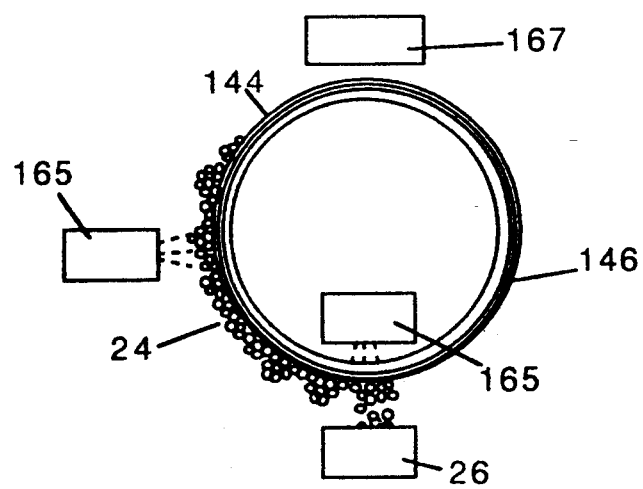
FIG. 23(b) is a side view of the embodiment of FIG. 23(a) showing microcapsules being attracted and imagewise exposed on the rotating drum.

As shown in FIG. 23(b), light information from the information light source 165 disposed inside the hollow rotating drum 164 causes the optoelectric, optomagnetic coating 146 to produce an attractive field at the surface of the drum 164. Microcapsules 24 from a microcapsule source 26 are attracted to the surface of the rotating drum 164 (or to the surface of a recording sheet disposed on the rotating drum 164). As the drum 164 rotates, the layer of microcapsules 24 become disposed facing another information light source 165 (which may be configured as described with reference to the information light source disposed inside the drum 164). This other information light source 165 image-wise exposes the microcapsule 24 layer to produce a latent image. The latent image is then developed (not shown). Also, an erasing device 167 may be used to reset the magnetic or electrostatic field of the optoelectric, optomagnetic coating 146.

Figure 24A:
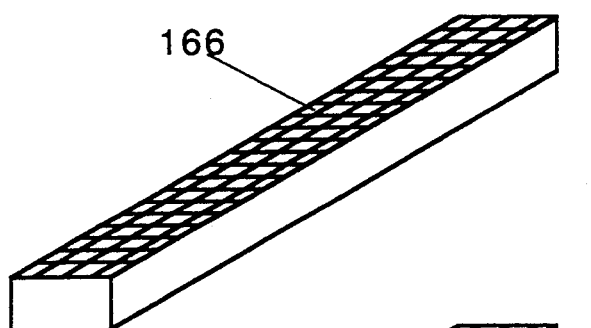
FIG. 24(a) is an isolated view of a light source configured as an LED or diode laser matrix.
Figure 24B:
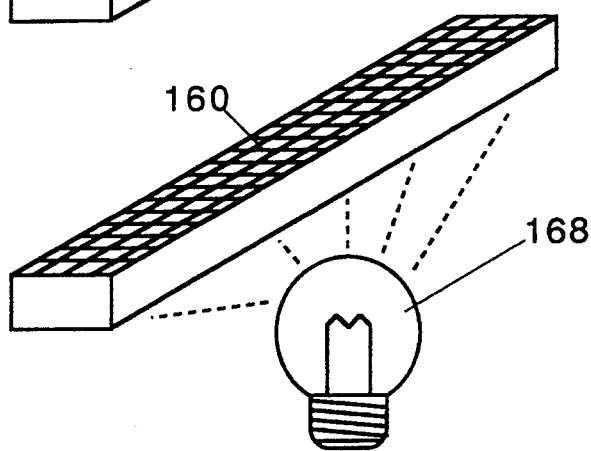
FIG. 24(b) is an isolated view of a light source configured as an liquid crystal light valve.
Figure 24C:
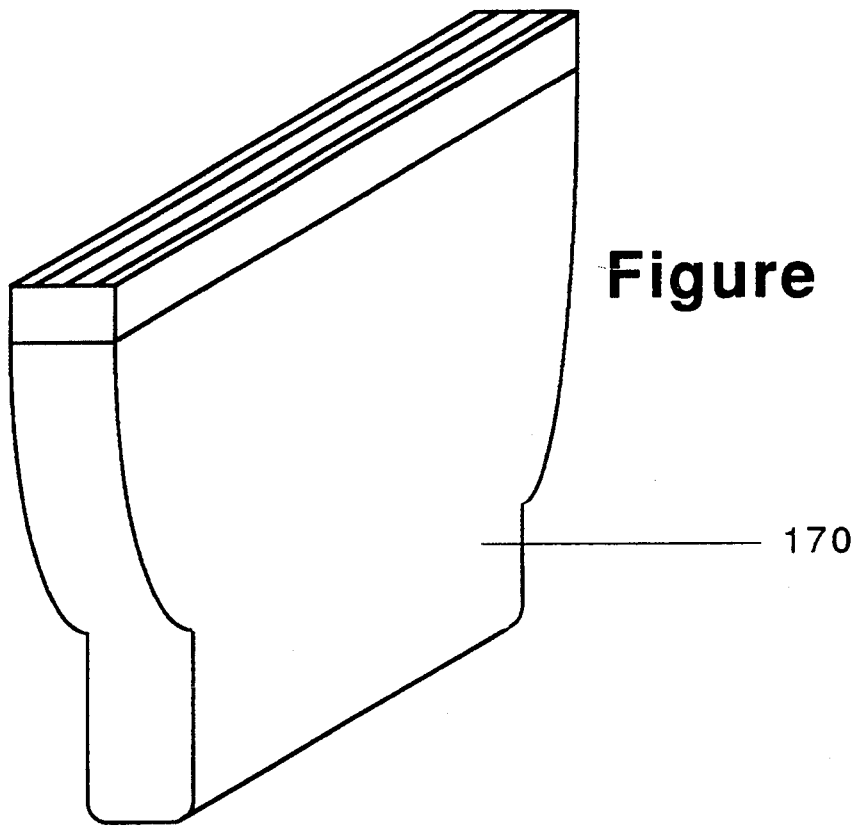
FIG. 24(c) is an isolated view of a light source configured as a cathode ray tube.
Figure 24D:
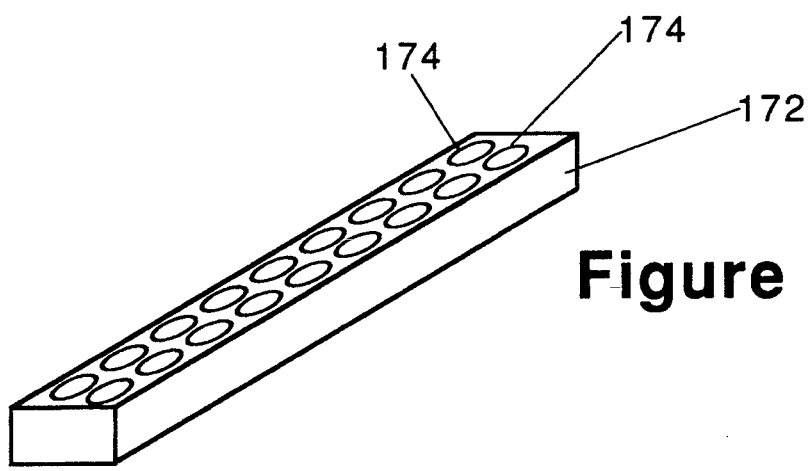
FIG. 24(d) is an isolated view of a light source configured as an array of fiber-optic cable ends.

FIGS. 24(a)–24(d) show various configurations for the information light source. FIG. 24(a) shows the information light source configured as an LED or diode laser matrix 166; FIG. 24(b) shows the information light source configured as an liquid crystal light valve 160 having back lighting 168; FIG. 24(c) shows the information light source configured as a cathode ray tube 170; and FIG. 24(d) shows the information light source configured as an array of fiber-optic cable ends 172. The size of each element 174 of the array or matrix is exaggerated for illustration. The actual dimensions may vary depending on considerations such as costs, required resolution, space, etc.

With respect to the above description, it is realized that the optimum dimensional relationships for parts of the invention, including variations in size, materials, shape, form, function, and manner of operation, assembly and use, are deemed readily apparent and obvious to one skilled in the art. All equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described. Accordingly, all suitable modifications and equivalents may be resorted to, falling within the scope of the invention.

I claim:

1. A printer for forming an image in a layer of microcapsules, comprising: image receiving means for receiving an image in a layer of field attractive microcapsules, the image receiving means comprising a locally variable attractive field member and controlling means for controlling the locally variable attractive field member to selectively apply an attractive field at at least one predetermined location of the locally variable attractive field member so that a layer of field attractive microcapsules can be formed by selectively applying a corresponding local attractive field at the at least one predetermined location of the locally variable attractive field member.

2. A printer for forming an image in a layer of microcapsules according to claim 1; wherein said locally variable attractive field member further comprises at least one of an optoelectric and an optomagnetic coating formed on a transparent substrate for generating an attractive field in response to light impinging on the at least one optoelectric and optomagnetic coating.

3. A printer for forming an image in a layer of microcapsules according to claim 2; wherein the at least one optoelectric and optomagnetic coating is etched into pixels.

4. A printer for forming an image in a layer of microcapsules according to claim 2; further comprising directing means for directing a light beam to impinge on the at least one optoelectric and optomagnetic coating for generating at least one of a magnetic field and an electrostatic field in order to form a respective attractive field at corresponding discrete locations of said at least one optoelectric and optomagnetic coating.

5. A printer for forming an image in a layer of microcapsules according to claim 4; wherein the directing means comprises a plurality of fiber optic light guides.

6. A printer for forming an image in a layer of microcapsules according to claim 4; wherein the directing means further comprises a light beam source for generating a light beam and a scanning means for scanning the light beam over the at least one optoelectric and optomagnetic coating for generating an attractive field in order to form a respective attractive field at corresponding discrete locations of the at least one of an optoelectric and optomagnetic coating.

7. A printer for forming an image in a layer of microcapsules according to claim 2; wherein said locally variable attractive field member further comprises a light emitting coating on the transparent substrate for generating light, the generated light impinging on at least one of an optoelectric and optomagnetic coating to generate at least one of an electrostatic and magnetic attractive field.

8. A printer for forming an image in a layer of microcapsules according to claim 2; wherein said locally variable attractive field member further comprises a light shielding layer.

9. A printer for forming an image in a layer of microcapsules according to claim 1; wherein the image receiving means further comprises a cathode ray tube for supplying a light image, said locally variable attractive field member further comprises a transparent substrate and at least one of an optoelectric and optomagnetic coating disposed on the transparent substrate for generating an attractive field in response to the light image impinging on the at least one optoelectric and optomagnetic coating.

10. A printer for forming an image in a layer of microcapsules according to claim 1; wherein at least some of the field attractive microcapsules are chromogenic; and further comprising image forming means for image-wise exposing the chromogenic microcapsules to form a latent image therein; and image developing means for developing the latent image to form an observable image.

11. A printer for forming an image in a layer of microcapsules according to claim 1; further comprising recording sheet supplying means for supplying a recording sheet to the image receiving means, said recording sheet for supporting the layer of locally attracted field attractive microcapsules.

12. A printer for forming an image in a layer of microcapsules according to claim 1; wherein at least some of the field attractive microcapsules are magnetically attractive; and said locally variable attractive field member further comprises magnetic field applying means for applying each local attractive field as a magnetically attractive field.

13. A printer for forming an image in a layer of microcapsules according to claim 1; wherein at least some of the field attractive microcapsules are electrostatically attractive; and said locally variable attractive field member further comprises electrostatic field applying means for applying each local attractive field as an electrostatically attractive field.

14. A printer for forming an image in a layer of microcapsules according to claim 1; further comprising image forming means for image-wise exposing chromogenic microcapsules to form a latent image therein; and wherein at least some of the field attractive microcapsules are chromogenic microcapsules and include at least two color forming microcapsule compositions capable of forming at least a two color latent image upon image-wise exposure by the image forming means.

15. A printer for forming an image in a layer of microcapsules according to claim 1; wherein at least some of the field attractive microcapsules include at least one of a thermo-expansive composition and a heat meltable composition.

16. A printer for forming an image in a layer of microcapsules according to claim 1; wherein at least some of the field attractive microcapsules include a magnetic material comprising at least one of a wall of the microcapsules and an internal phase of the microcapsules, said magnetic material being effective to make the microcapsules, magnetically attractive to a magnetically attractive field applied as the respective local attractive filed at the at least one predetermined location of said locally variable attractive field member.

17. A printer for forming an image in a layer of microcapsules comprising: a hollow cylindrically shaped locally variable attractive field member comprising a transparent substrate and at least one of an optoelectric and optomagnetic coating disposed on the transparent substrate for generating an attractive field in response to light impinging on the at least one optoelectric and optomagnetic coating: and a light information source disposed in the interior of the hollow cylindrically shaped locally variable attractive field member for supplying a light beam to pass through the transparent substrate and impinge on either of the optoelectric and optomagnetic coating to generate an attractive field at locations of the hollow cylindrically shaped locally variable attractive field member for attracting a layer of field attractive microcapsules.

18. A printer for forming an image in a layer of microcapsules according to claim 17; wherein the information light source comprises at least one of an LED matrix, a diode laser matrix, a liquid crystal light valve, a cathode ray tube, an electron gun, and an array of fiber-optic cable ends.

19. A printer for forming an image in a layer of microcapsules, comprising: a hollow cylindrically shaped locally variable attractive field member comprising a transparent substrate and at least one of an optoelectric and optomagnetic coating disposed on the transparent substrate for generating an attractive field in response to light impinging on the at least one optoelectric and optomagnetic coating; and a light information source comprising an electron gun disposed in the interior of the hollow cylindrically shaped locally variable attractive field member for supplying an electron beam and a light emitting coating formed on the hollow cylindrically shaped locally variable attractive field member effective in response to the electron beam to generate a light beam to pass through the transparent substrate and impinge to either of the optoelectric and optomagnetic coating to generate an attractive field at locations of the hollow cylindrically shaped locally variable attractive field member for attracting a layer of field attractive microcapsules.

* * * * *